US006809591B1

United States Patent
Ohashi

(10) Patent No.: US 6,809,591 B1
(45) Date of Patent: Oct. 26, 2004

(54) AGC CIRCUIT PROVIDING CONTROL OF OUTPUT SIGNAL AMPLITUDE AND OF OUTPUT SIGNAL DC LEVEL

(75) Inventor: Naomi Ohashi, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/457,558

(22) Filed: Jun. 10, 2003

(51) Int. Cl.[7] .............................. H03G 3/10; H03F 3/45
(52) U.S. Cl. ...................................... 330/279; 330/254
(58) Field of Search ................................ 330/279, 254

(56) References Cited

U.S. PATENT DOCUMENTS

| | | | | |
|---|---|---|---|---|
| 4,471,317 A | * | 9/1984 | Nilsson et al. | 330/141 |
| 4,829,267 A | * | 5/1989 | Sandusky | 330/259 |
| 5,132,828 A | * | 7/1992 | Conner et al. | 398/158 |

FOREIGN PATENT DOCUMENTS

| | | |
|---|---|---|
| JP | 9-246887 | 9/1997 |
| JP | 9-307379 | 11/1997 |
| JP | 11-186860 | 7/1999 |

OTHER PUBLICATIONS

US Patent Application Publication US 2004/0119543 A1, Jun. 24, 2004, Denoyer et al., Wide Dynamic Range Transimpedance Amplifier With a Controlled Low Frequency Cutoff At High Optical Power.*

* cited by examiner

Primary Examiner—Patricia Nguyen
(74) Attorney, Agent, or Firm—Louis Woo

(57) ABSTRACT

An AGC circuit suitable for applications such as an optical receiving apparatus includes a differential amplification adjustment circuit section for operating on a pair of input signals to produce a corresponding pair of complementary controlled output signals having a fixed amplitude, a peak detector for detecting a peak value of at least one of the controlled output signals, a DC monitoring circuit for detecting the DC level of at least one of the controlled output signals, and an amplitude fixing control circuit for deriving a value of voltage difference between the peak value and DC level and for generating an amplitude control signal based on comparing the voltage difference with a reference voltage. The differential amplification adjustment circuit section applies a degree of amplification that is determined by the amplitude control signal, to thereby perform feedback control of the output signal amplitude. The AGC circuit can further be configured to control the DC levels of the controlled output signals, so that both DC level and amplitude of the controlled output signals are held constant against changes in DC level and amplitude of the input signals.

26 Claims, 25 Drawing Sheets

FIG. 2B
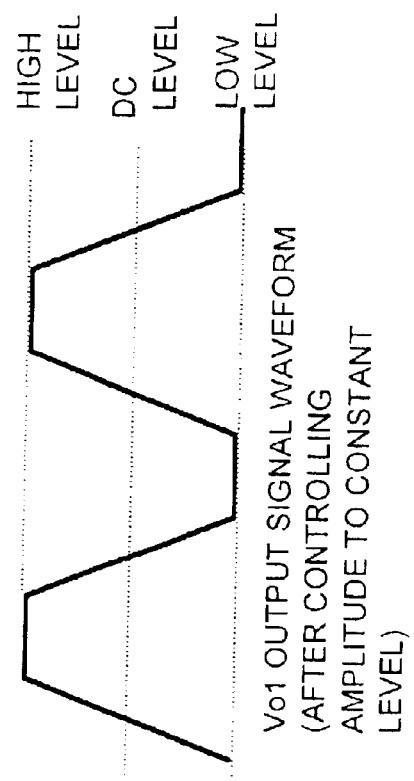
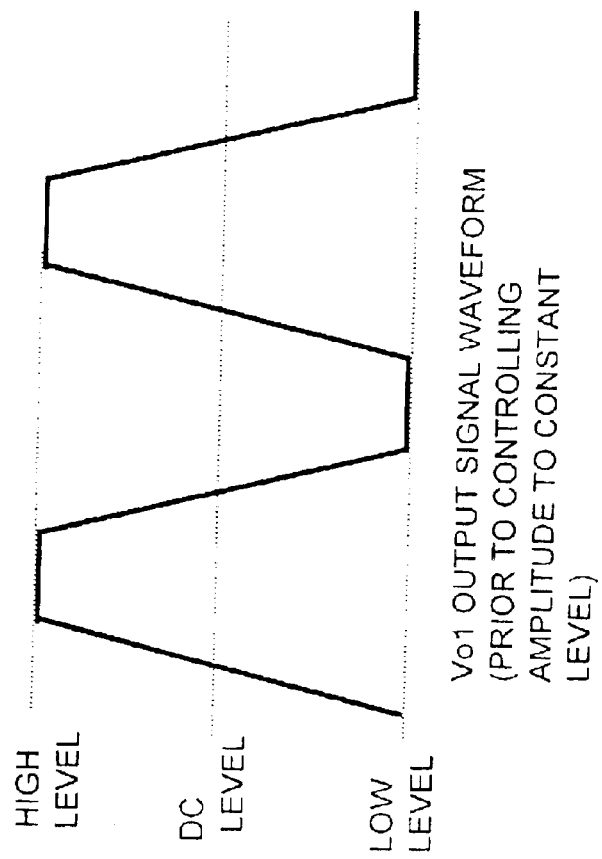

FIG. 8B
Vo1, Vo2 OUTPUT SIGNAL WAVEFORMS (PRIOR TO CONTROLLING AMPLITUDE TO CONSTANT LEVEL)
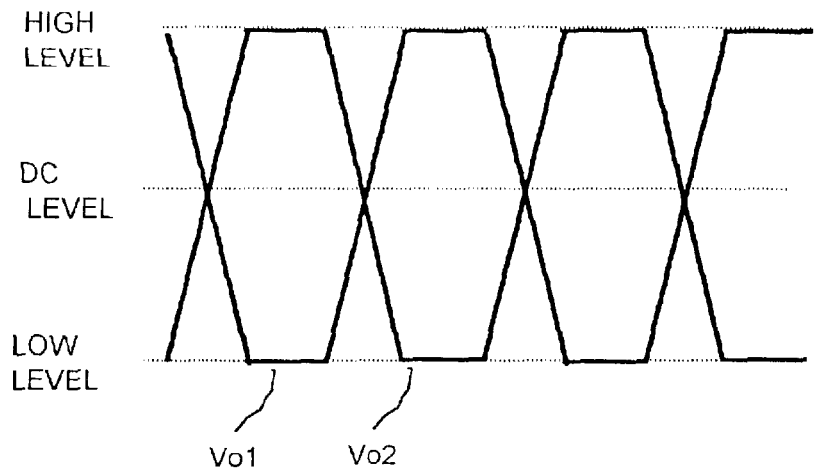
Vo1   Vo2
Vo1, Vo2 OUTPUT SIGNAL WAVEFORMS (AFTER CONTROLLING AMPLITUDE TO CONSTANT LEVEL)
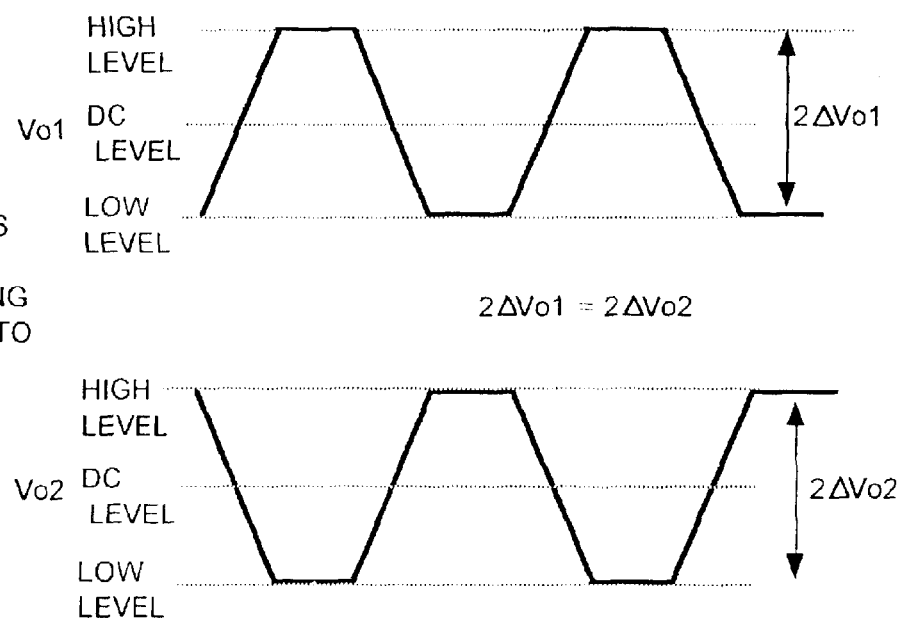
$2\Delta Vo1 = 2\Delta Vo2$

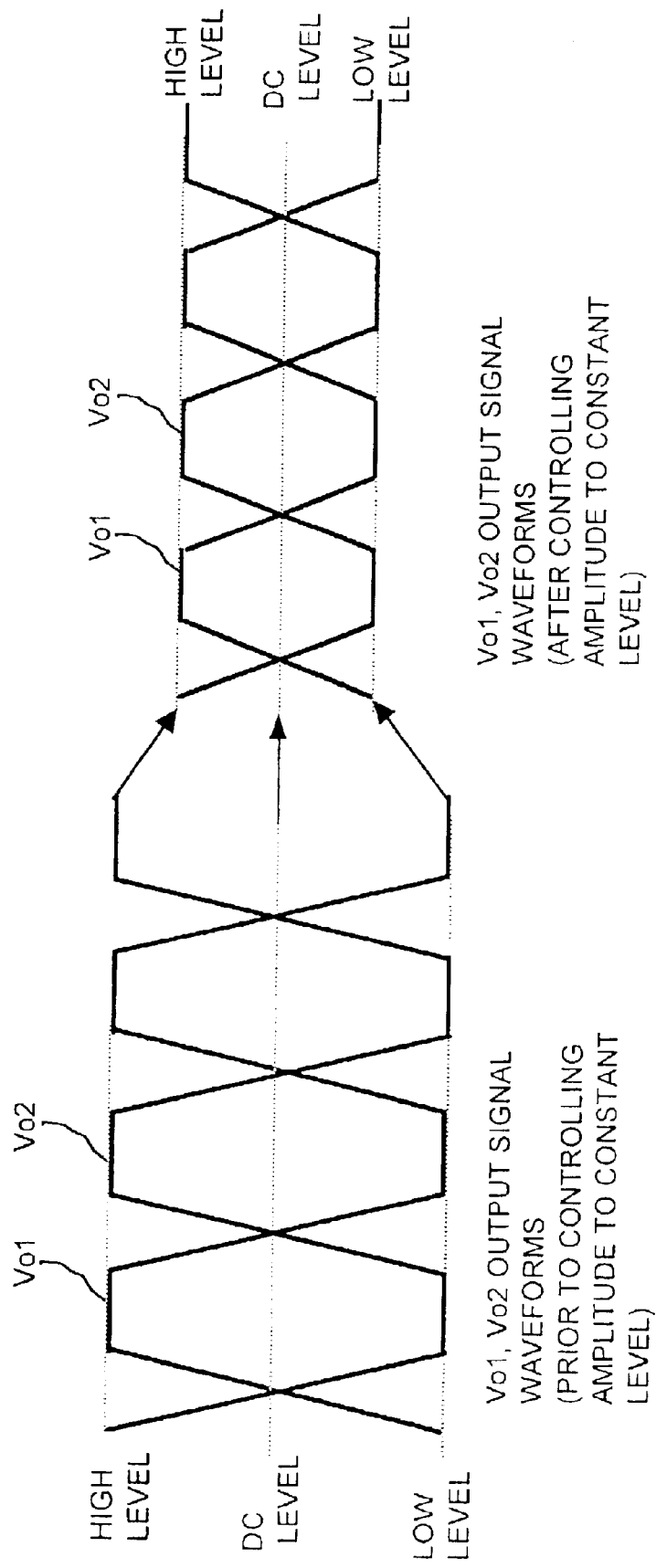

AGC CIRCUIT PROVIDING CONTROL OF OUTPUT SIGNAL AMPLITUDE AND OF OUTPUT SIGNAL DC LEVEL

BACKGROUND OF THE INVENTION

1. Field of Technology

The present invention relates to an AGC (automatic gain control) circuit and to an optical data receiving apparatus and an optical data transmission system which incorporate such an AGC circuit.

2. Description of Prior Art

FIG. 21 is a block diagram of a prior art AGC circuit, formed of a gain adjustment section 101, an amplitude detection section 102, and a gain control section 103. The amplitude detection section 102 detects the amplitude of the input signal, gain control section 103 generates an amplifier control signal in accordance with the detected value, and the gain adjustment section performs control in accordance with the control signal, for converting the input signal which varies in amplitude to an output signal having fixed amplitude.

Another example of such a prior art type of AGC circuit for holding the amplitude of an output signal at a fixed value is disclosed in Japanese patent HEI 9-246887. In that case, the peak value of the output signal is detected, and a gain control signal is thereby generated by an external gain control circuit, with feedback of that gain control signal being applied to the AGC amplifier, for thereby holding the output signal amplitude from that amplifier to a fixed value.

However with the prior art AGC circuit of FIG. 21, when there is a large-amplitude input signal, the gain control section 101 may become unable to apply sufficient adjustment of gain, so that the amplitude of the output signal from the AGC circuit may vary. Furthermore with the AGC circuit of Japanese patent HEI 9-246887, the gain adjustment section within the AGC amplifier includes a number of FETs connected vertically (i.e., in series between a power supply voltage and ground potential), so that the overall circuit scale is large, and a substantially high value of power supply voltage becomes necessary.

SUMMARY OF THE INVENTION

It is an objective of the present invention to overcome the disadvantages of the prior art set out above, by providing an AGC circuit whereby the circuit configuration of an amplitude adjustment section can be simplified, and the power supply voltage requirements can be accordingly lowered, and whereby output signal A can be controlled to a substantially fixed amplitude value irrespective of variations in amplitude of input signals.

It is a further objective to provide an optical data receiving apparatus and an optical data transmission system which incorporate such an AGC circuit.

To achieve the above objectives, the invention provides an AGC circuit which operates on a pair of first and second input signals, having a gain-controlled amplifier which includes at least one differential amplification adjustment circuit section for amplifying the first and second input signals to produce complementary first and second controlled output signals having a controlled amplitude, a peak detector for detecting a peak value of at least one of the first and second controlled output signals, a DC monitoring circuit for measuring a value of a DC component of at least one of the first and second controlled output signals, and an amplitude fixing control circuit for deriving a value of voltage difference between the peak value and the DC component, and for generating an amplitude control signal based on comparing the voltage difference with an externally supplied reference voltage. The differential amplification adjustment circuit section applies a degree of amplification that is determined by the amplitude control signal, to thereby hold the amplitudes of the controlled output signals at a fixed value which is determined by the reference voltage.

More specifically, according to a first aspect, the peak detector derives a peak value of amplitude of a first one of the controlled output signal, and the DC component monitoring circuit derives a value of a DC component of that first controlled output signal, while the amplitude fixing control circuit derives a difference between the peak amplitude value and the DC component value and compares the difference with the amplitude control reference voltage, to obtain the amplitude control signal based on a result of the comparison.

The differential amplification adjustment circuit section includes a pair of FETs connected as a differential pair which amplify the input signals, having respective load resistors across which two differential signals are developed, and a pair of current source FETs connected in parallel with respective ones of the load resistors and having each of their gate electrodes coupled to receive the amplitude control signal. These current source FETs thereby adjust respective values of current flow in the load resistors in accordance with the amplitude control signal to thereby control respective amplitudes of the first and second controlled output signals.

Alternatively, a current source FET which is connected to respective source electrode of the differential pair of FETs has its gate electrode coupled to receive the amplitude control signal, to thereby adjust respective values of current flow in the load resistors of the differential FET pair in accordance with the amplitude control signal, and so control respective amplitudes of the first and second controlled output signals.

The gain-controlled amplifier may be configured with a plurality of differential amplifier circuit sections connected in cascade, for amplifying the first and second input signals of the AGC circuit to produce the complementary first and second output signals from a final stage, and a differential amplification adjustment circuit section which operates on these output signals, under the control of the amplitude control signal, for thereby producing the controlled output signals of the AGC circuit.

Alternatively, the amplifier circuit can be configured with a plurality of differential amplification adjustment circuit sections connected in cascade, for amplifying the first and second input signals of the AGC circuit and producing the complementary first and second controlled output signals of the AGC circuit from a final stage, with each of the differential amplification adjustment circuit sections being controlled by the amplitude control signal. In that case, a large dynamic range of input signal values can be handled, while maintaining a high degree of precision of control of amplitude of the output signals produced from the AGC circuit.

According to a second embodiment of the invention, amplitude control is applied directly to both of the controlled output signals of the AGC circuit. Specifically, the AGC circuit includes first and second peak detector circuits for peak detection of the first and second controlled output signals respectively, and first and second DC component monitoring circuits for deriving respective values of DC component of the first and second controlled output signals. In that case, the amplitude fixing control circuit derives the difference between the DC component of the first controlled output signal and the peak amplitude value of the first controlled output signal, and compares that difference with the amplitude control reference voltage to obtain a first amplitude control signal, and derives the difference between the DC component of the second controlled output signal and the peak amplitude value of the second controlled output signal, and comparing that second difference with the amplitude control reference voltage to obtain a second amplitude control signal. The first and second amplitude control signals are used in the differential amplification adjustment circuit to control the respective amplitudes of the two controlled output signals mutually independently.

According to a third embodiment of the invention, the amplifier circuit is configured for directly controlling the amplitude of a specific one of the pair of controlled output signals based on a single amplitude control signal, as described above, however in addition the AGC circuit includes a voltage control circuit coupled between the DC component monitoring circuit and the differential amplification adjustment circuit section, for comparing the DC component (i.e., value of DC level) of that specific one of the two controlled output signals with a second reference voltage, and generating a DC component control voltage in accordance with a result of the comparison. The differential amplification adjustment circuit is configured to adjust the DC component of each the controlled output signals in accordance with the DC component control voltage.

The differential amplification adjustment circuit section can be configured such that the DC component control voltage constitutes a variable power supply voltage, which is supplied to a common connection point of the load resistors of the differential FET pair and the drain electrodes of the aforementioned pair of current source FETs that are connected respectively in parallel with these load resistors.

Alternatively, the differential amplification adjustment circuit section can be configured with a parallel combination of a third current source FET and a third resistor, which are connected between a power supply voltage and the aforementioned common connection point. In that case, the DC component control voltage constitutes a control signal which is applied to the gate electrode of the third current source FET, for thereby controllably bypassing the current which flows through the third resistor, and thereby adjusting the actual power supply voltage which is applied to the common connection point.

In either case, the respective DC levels of the output signals from the differential FET pair (and hence of the pair of controlled output signals which are produced from the AGC circuit) are adjusted together by the DC component control voltage.

According to a fourth embodiment, the DC levels of the controlled output signals from the AGC circuit are detected respectively separately, and respective first and second DC level detection signals are supplied to the voltage control circuit. In that case, the voltage control circuit produces corresponding first and second DC component control voltages. These can be applied as respective supply voltages to the two load resistors of the differential FET pair, or may be applied as respective control signals to a first parallel combination of a current source FET and a resistor, which control the level of supply voltage applied to the first load resistor of the differential FET pair, and to a second such parallel combination, which controls the level of supply voltage applied to the second load resistor of the differential FET pair.

In either case, the respective DC levels of the output signals from the differential FET pair (and hence of the pair of controlled output signals produced from the AGC circuit) are adjusted mutually independently, by the first and second DC component control voltages.

BRIEF DESCRIPTION OF THE DRAWINGS

FIG. 2B is a corresponding waveform diagram;

FIG. 8A is a circuit diagram showing the internal configuration of a differential amplification adjustment circuit section in the second embodiment, and showing connections to peripheral circuit sections, while FIG. 8B is a corresponding waveform diagram;

FIG. 17B is a corresponding waveform diagram;

DESCRIPTION OF PREFERRED EMBODIMENTS

First Embodiment

Figure 1:
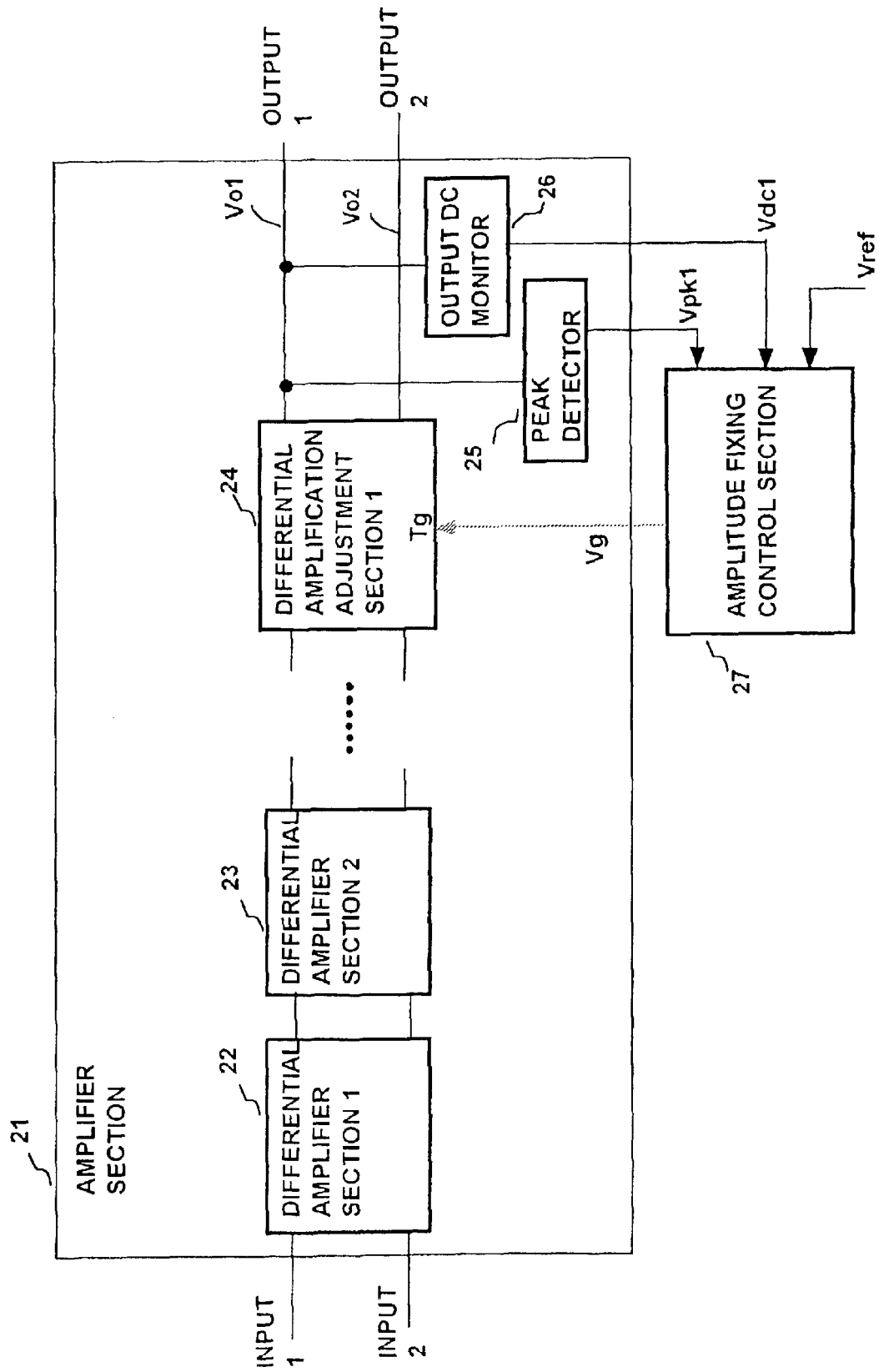
FIG. 1 is a general system block diagram of a first embodiment of an AGC circuit.
Figure 2A:
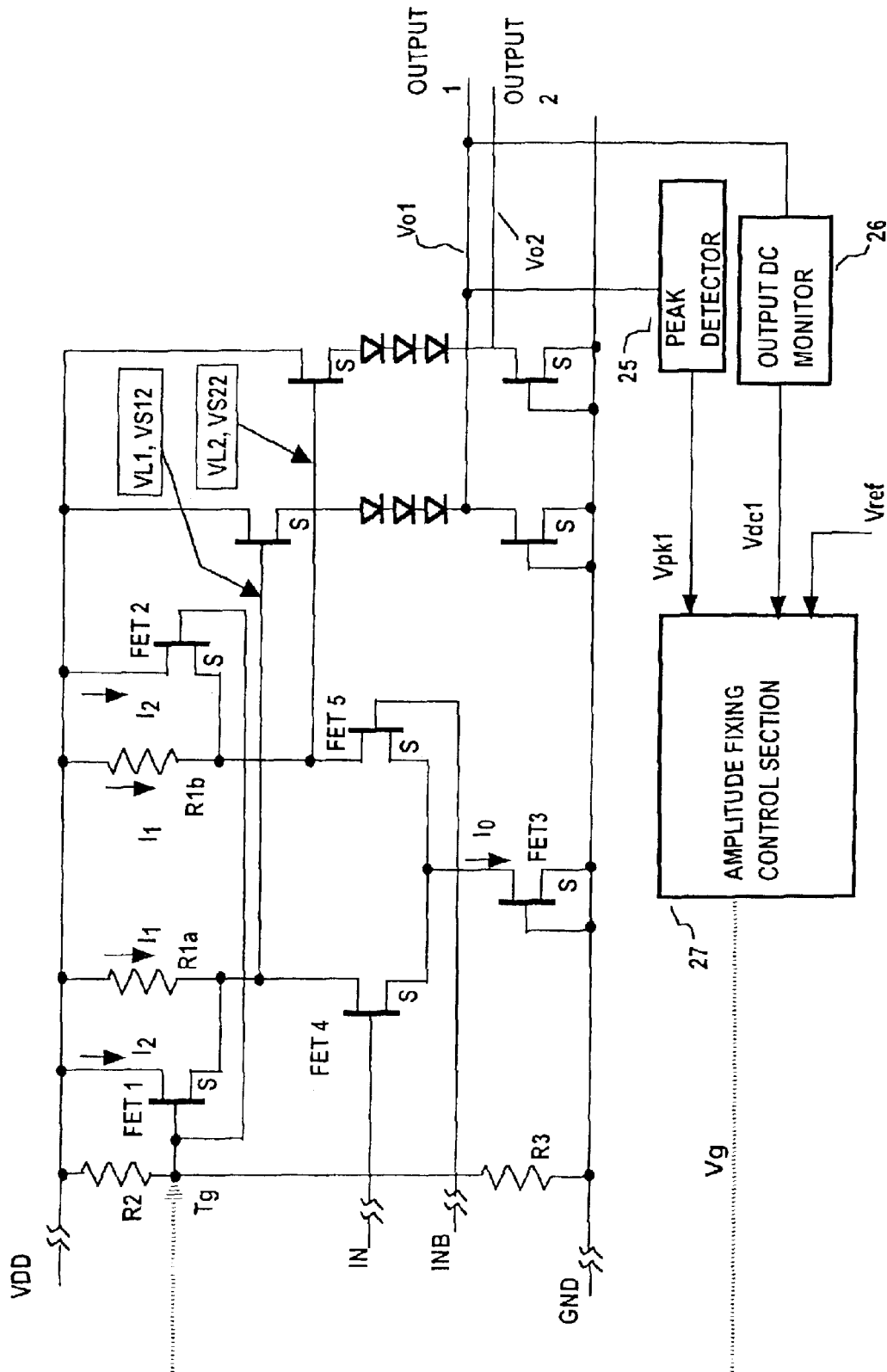
FIG. 2A is a circuit diagram showing the internal configuration of a differential amplification adjustment circuit section in the first embodiment, and showing connections to peripheral circuit sections.
Figure 3:
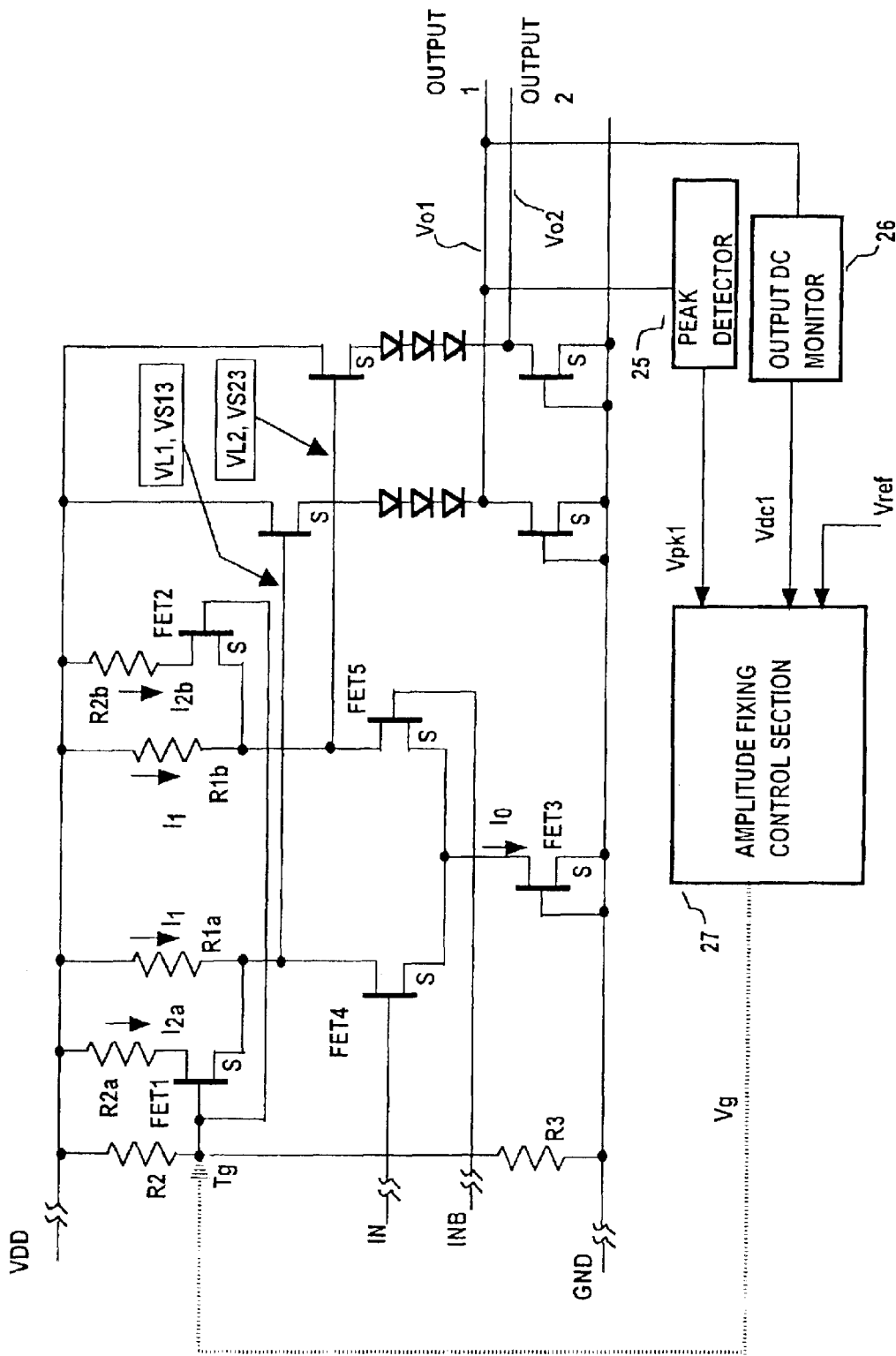
FIG. 3 is a circuit diagram showing a second example of the internal configuration of a differential amplification adjustment circuit section in the first embodiment, and showing connections to peripheral circuit sections.
Figure 4:
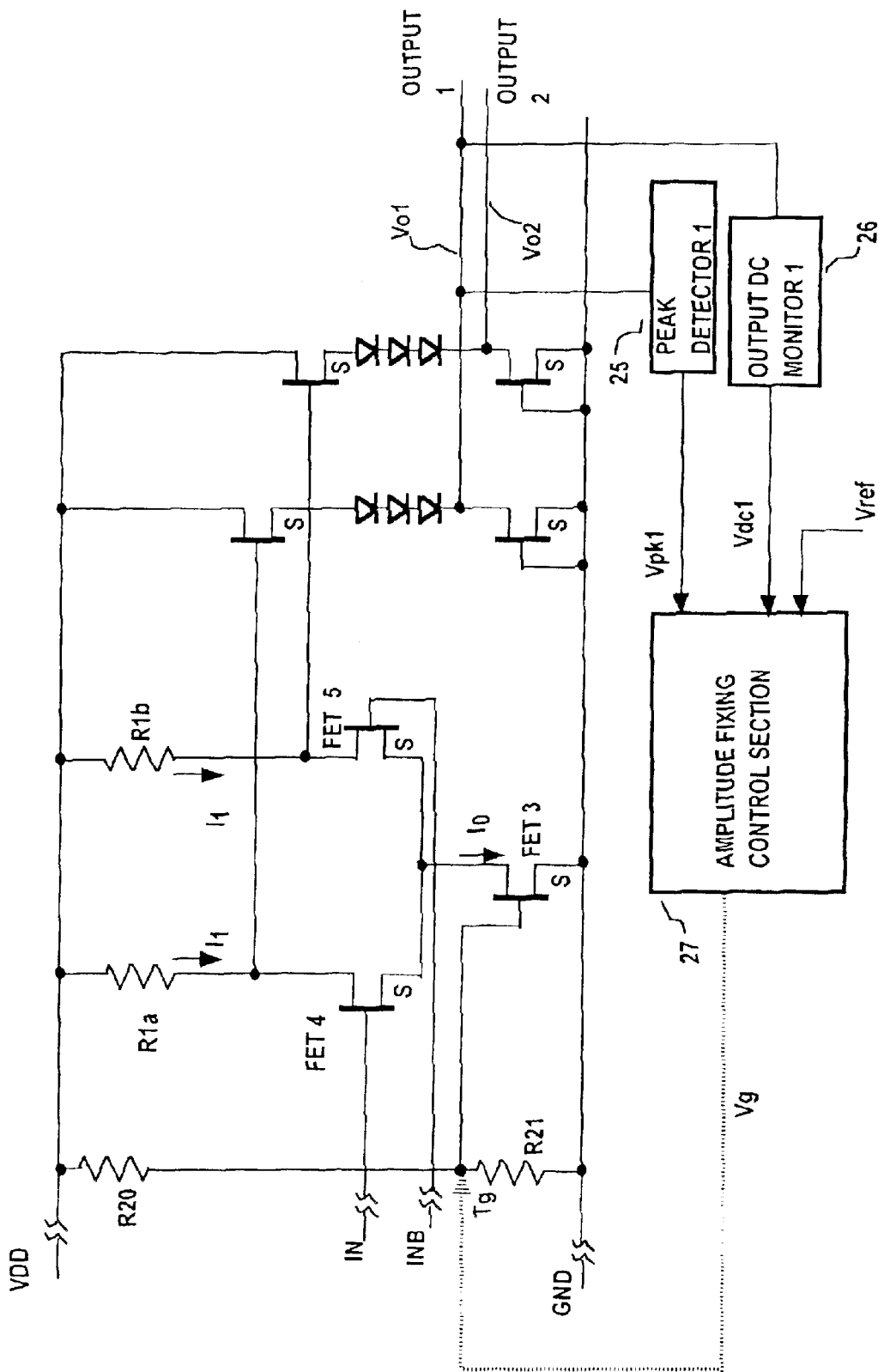
FIG. 4 is a circuit diagram showing a third example of the internal configuration of a differential amplification adjustment circuit section in the first embodiment, and showing connections to peripheral circuit sections.

FIG. 1 is a system block diagram showing the overall configuration of a first embodiment of an AGC circuit, while FIGS. 2 to 4 show respective circuits of three examples of the configuration of a differential amplification adjustment circuit section in the first embodiment.

As shown in FIG. 1, the AGC circuit is basically formed of an amplifier section 21 and an amplitude fixing control section 27. The amplifier section 21 includes a plurality of differential amplifier sections 22, 23 etc., connected in series as successive stages, and a differential amplitude adjustment circuit section 24. A pair of input signals of the AGC circuit, designated as Input 1 and Input 2, are supplied to a first stage of the plurality of differential amplifier sections, designated by numeral 22, and a complementary pair of first and second output signals are produced from the final stage and supplied to the differential amplitude adjustment circuit section 24, to be adjusted in amplitude as described hereinafter and thereby outputted as a complementary pair of fixed-amplitude first and second output signals designated as Vo1 and Vo2 respectively, which will be referred to in the following description and in the appended claims as the first and second controlled output signals of the AGC circuit, having respective amplitudes which are substantially identical. The amplifier section 21 further includes a peak detector circuit 25 which derives the peak value of amplitude of a specific one of the first and second controlled output signals Vo1, Vo2, assumed in this example to be Vo1, and moreover includes a output DC monitor circuit 26 which derives the value of the DC component of that specific one of the first and second controlled output signals. The peak value and the DC component value are obtained as respective detection signals, designated as Vpk1 and Vdc1, which are supplied to the amplitude fixing control section 27 together with an externally supplied reference voltage Vref, referred to in the following as the amplitude 1C control reference voltage.

The amplitude fixing control section 27 derives the voltage difference between Vpk1 and Vdc1, with that difference value designated in the following as ΔVo1, and compares that difference value ΔVo1 with the amplitude control reference voltage Vref, with an amplitude control signal Vg being generated in accordance with the result of the comparison, and applied to an input terminal Tg of the differential amplitude adjustment circuit section 24. It should be noted that the term "input terminal", as used herein, signifies a connection point within a circuit, at which a specific externally supplied input signal is applied. The value of Vref is set as one-half of the required value of amplitude for signal Vo1. Since it can be understood from the above that an internal configuration for the amplitude fixing control section 27 can readily be envisaged, detailed description is omitted.

With this embodiment, when ΔVo1>Vref, the control signal produced from the amplitude fixing control section 27 (referred to in the following as the amplitude control signal Vg) and supplied to the input terminal Tg of the differential amplitude adjustment circuit section 24 attains a value such as to reduce the amplitude of output signal Vo1. If ΔVo1<Vref, then the amplifier control signal attains a value such as to increase the amplitude of the output signal Vo1. Such processing is repetitively executed until ΔVo1 becomes equal to Vref. The amplitude of the output signal Vo1 is thereby fixed at the required value.

When power starts to be applied to the circuits, a fixedly predetermined DC voltage is applied internally to the terminal Tg within the differential amplitude adjustment circuit section 24. After the amplitude control signal Vg begins to be supplied from the amplitude fixing control section 27, the potential of the terminal Tg becomes that of the control signal Vg.

An example of a circuit for the differential amplitude adjustment circuit section 24, and the operation of that circuit, will be described referring to FIG. 2A. This shows the circuit configuration of the differential amplitude adjustment circuit section 24, together with the connection relationships of that circuit to the peak detector circuit 25, output DC monitor circuit 26 and amplitude fixing control section 27. The circuit is powered by a power supply voltage Vdd, applied with respect to ground potential GND. The circuit includes a differential amplifier circuit formed of FETs FET 4 and FET 5 which have matched characteristics and are connected as a differential pair, having respective load resistors R1a, R1b that are of identical value, and having a common-source connection to a current source which is constituted by a FET 3.

In the following description and in the appended claims, the term "current source FET" is used to signify a FET which is operated within a region of its characteristics whereby the level of current passed by the FET is determined only by the applied gate electrode voltage, and which functions as a current-regulating element.

Current source FETs 1 and 2, having matched characteristics, are respectively connected in parallel with the load resistors R1a, R1b and have respective gate electrodes thereof connected in common to receive the amplitude control signal Vg from the amplitude fixing control section 27. The common connection of the gate electrodes of FET 1, FET 2, which corresponds to the aforementioned input terminal Tg, is connected to the junction of two resistors R2, R3 that are connected in series between Vdd and ground potential. Differential input signals designated as IN and INB, which are outputted from the final stage of the series of differential amplifier circuit sections, are applied to the gate electrodes of FET 4 and FET 5 respectively.

An initial level of voltage determined by the values of R2, R3 is applied to the input terminal Tg when the power supply voltage Vdd is first applied, and thereafter the input terminal Tg is set to a potential which is determined by the amplitude control signal Vg, when that begins to be supplied from the amplitude fixing control section 27.

Differential signals which are produced at the junction of FET 4 and load resistor R1a and at the junction of FET 5 and load resistor R1b, respectively, are supplied to respective source-follower stages as shown, to be produced therefrom as the aforementioned Vo1 and Vo2 complementary output signals of the AGC circuit.

Designating the current which flows in the current source FET 3 as I0, designating as I1 the total current which flows in resistors R1*a*, R1*b*, and designating the total current which flows in FETs 1 and 2 as I2, the following is true:

$$I0 = I1 + I2 \quad (1)$$

Hence, designating the maximum amplitudes of the differential output signals produced from the differential circuit as VL1 and VL2, and the value of each of R1*a*, R1*b* as r1, $$VL1(VL2) = r1 \times I1 \quad (2)$$

With this configuration, if ΔVo1>Vref, the amplitude control signal Vg is set to a value such as to reduce the value of current I1 and increase the value of current I2, to thereby decrease the amplitude of the output signal Vo1. Conversely, if ΔVo1<Vref, then the amplifier control signal attains a value such as to increase the value of current I1 and decrease the value of current I2, to thereby increase the amplitude of the output signal Vo1. These operations occur repetitively, until ΔVo1 becomes equal to Vref. The amplitude of the output signal Vo1 is thereby fixed at the required value, as illustrated in the waveform diagram of FIG. 2B.

A second example of the circuit configuration of the differential amplitude adjustment circuit section 24 of the first embodiment will be described referring to FIG. 3, which shows that circuit configuration together with the connection relationships to the peak detector circuit 25, output DC monitor circuit 26 and amplitude fixing control section 27. This differs from the circuit configuration example of FIG. 2A by the addition of a resistor R2*a* which is connected in series with the current source FET 1 and resistor R2*b* which is connected in series with the current source FET 2, with these resistors R2*a*, R2*b* having an identical value of resistance which will be designated as R2, with the resistance value of each of the resistors R1*a*, R1*b* designated as R1.

In the same way as for the example of FIG. 2, designating the value of current which flows in the current source FET 3 as Io, the value of current which flows in FET 1, FET 2 as I2, and with the current I1 defined as for the example of FIG. 2, equation (1) above is valid. Hence, the maximum values of the differential output signals produced from the differential circuit, VL1 and VL2, are each defined by equation (2) above. However with the configuration of FIG. 3, due to the series resistors R2*a*, R2*b*, the minimum values of amplitude of the differential output signals produced from the differential circuit are different from those of FIG. 2A.

Specifically, assuming that each of the resistors R2*a*, R2*b*, R1*a*, R1*b* are of identical value, then the condition I1>I2 can occur, however the condition I1<I2 cannot occur. Designating the minimum amplitudes of the differential output signals from the differential circuit in FIG. 2 as VS12, VS22 respectively, the value of each of R1*a*, R1*b* as r1 and the value of each of R2*a*, R2*b* as r2, and designating the minimum amplitudes of the differential output signals from the differential circuit in FIG. 3 as VS13, VS23 respectively, the following equations are valid:

$$VS12(VS22) \approx 0 \quad (3)$$

$$VS13(VS23) = (\tfrac{1}{2}) \times VL1(VL2) \quad (4)$$

By expressing VS13 and VS23 using VL1, VL2, R1 and R2, the following equation is obtained:

$$VS13(VS23) = (r1/(r1+r2)) \times VL1(VL2) \quad (5)$$

Hence, the lower limit of the amplitude of the output signal Vo1 can be arbitrarily determined by the value of r2.

Thus it can be understood that with the circuit of FIG. 3, the amplitude control signal Vg acts to maintain the amplitude of the output signal Vo1 at a fixed value, which is within a range extending from a maximum value that is expressed by equation (2) and a minimum amplitude value that is expressed by equation (5).

A third example of the circuit configuration of the differential amplitude adjustment circuit section 24 of the first embodiment will be described referring to FIG. 4, which shows that circuit configuration together with the connection relationships to the peak detector circuit 25, output DC monitor circuit 26 and amplitude fixing control section 27. In this case, the input terminal Tg corresponds to the gate electrode of the current source FET 3, and an initial value of voltage is applied to that gate electrode when power is applied to the circuit by the resistive voltage divider formed of resistors R20, R21. In the same way as described for the circuit of FIG. 2, when the amplitude control signal Vg begins to be supplied, the gate electrode of FET 3 is set to a potential determined by that control signal.

In this case, defining the current that flows in load resistors R1*a*, R1*b* as I1 and the current which flows in the current source FET 3 as I0, in the same way as for the circuit of FIG. 2, the following is true:

$$I0 = I1 \quad (6)$$

Hence, the maximum amplitude (VL1, VL2) of output signal from the differential circuit is given by equation (2) above, and so the amplitude of the output signal Vo1 can be adjusted by applying the amplitude control signal Vg from the amplitude fixing control section 27 to alter the gate voltage of FET 3, to thereby vary the value of current I0.

Specifically, if ΔVo1>Vref, the amplitude control signal Vg is set to a value such as to reduce the value of current I0, to thereby decrease the amplitude of the output signal Vo1. Conversely, if ΔVo1<Vref, then the amplitude control signal Vg attains a value such as to increase the value of current I0, to thereby increase the amplitude of the output signal Vo1. These operations occur repetitively, until ΔVo1 becomes equal to Vref. The amplitude of the output signal Vo1 is thereby fixed at the required value, as illustrated in FIG. 2B.

An alternative configuration of the first embodiment will be described referring to the general system block diagram of FIG. 5. This differs from the configuration shown in FIG. 1 only in that the amplifier section 21 includes a cascaded series of n differential amplification adjustment circuit sections indicated as 122, 123, . . . , 124, with the input signals Input 1, Input 2 to the amplifier section 21 being supplied to an initial stage of these differential amplification adjustment circuit sections and the controlled output signals Vo1, Vo2 being produced from the n-th (final) stage 124.

With this configuration, the amplitude control signal Vg which is produced from the amplitude fixing control section 27 is supplied to each of the differential amplification adjustment circuit sections 122 to 124, and each of these can have a circuit configuration as shown in FIG. 2, FIG. 3 or FIG. 4 described hereinabove.

Figure 5:
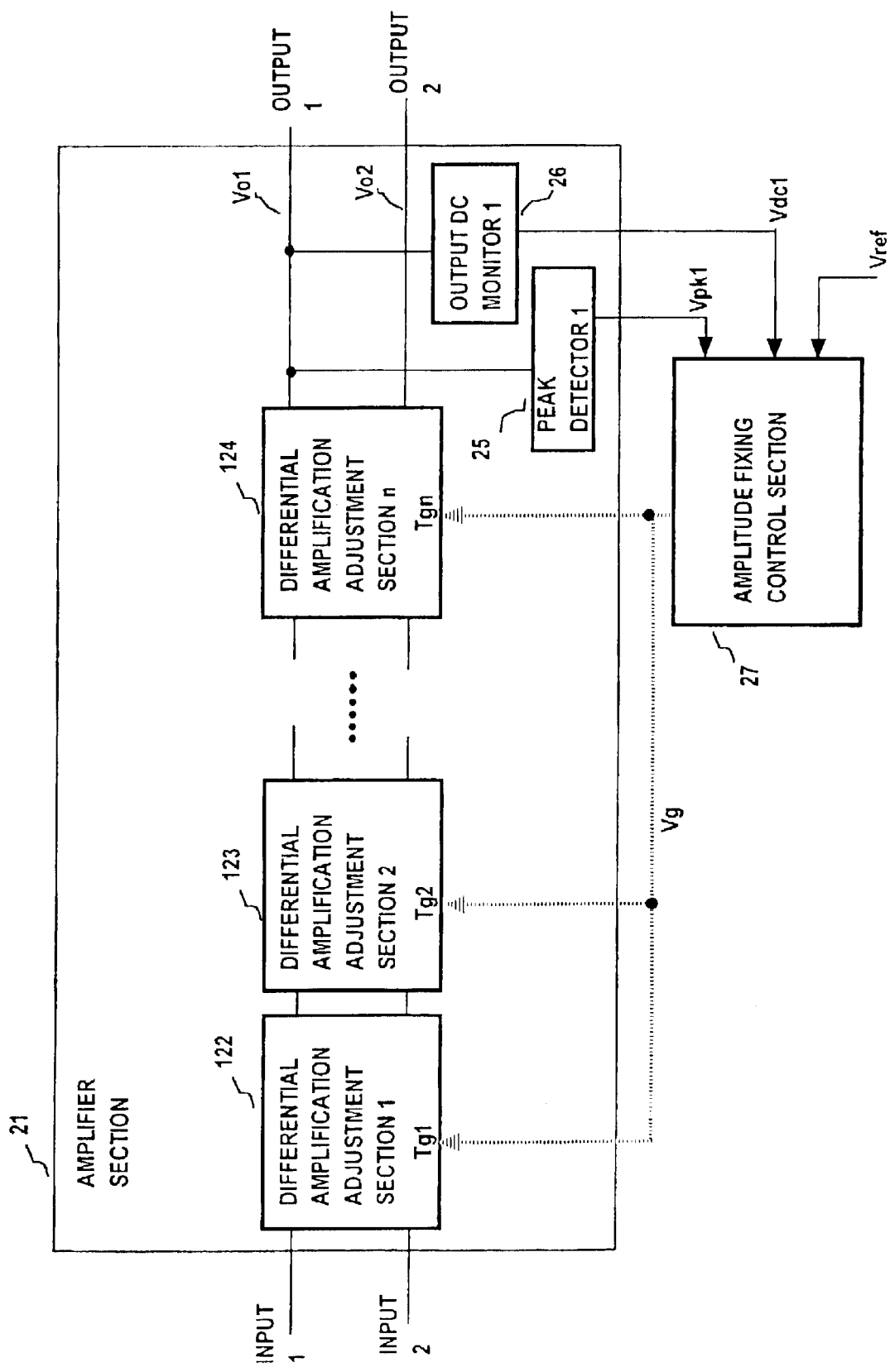
FIG. 5 is a general system block diagram of an alternative configuration of the first embodiment.

With the configuration of FIG. 5, the dynamic range of input signal amplitude for which the output signal level Vo1 is constant is n times that of the configuration of FIG. 1.

As can be understood from the above description, with the first embodiment, the peak level of one of the two controlled complementary output signals Vo1, Vo2 from an amplifier section 21 is detected by the peak detector circuit 25, and the DC component of that signal is detected by the output DC monitor circuit 26, and these values are operated on by the amplitude fixing control section 27 to derive an amplitude control signal Vg which is applied to an input terminal Tg of a differential amplification adjustment circuit section constituting an output stage in the amplifier section, or to the respective input terminals Tg1 to Tgn of a plurality of cascaded differential amplification adjustment circuit sections in the amplifier section, whereby the controlled output signals Vo1, Vo2 are held to respective fixed values of amplitude irrespective of variations in amplitude of the input signals Input 1, Input 2 that are supplied to the amplifier section 21.

It will be understood from the descriptions of FIGS. 2, 3 and 4 that the invention enables a substantial degree of simplification of the circuit configuration of a differential amplification adjustment circuit, so that the power supply voltage requirements can be lowered, by comparison with the prior art.

Figure 6:
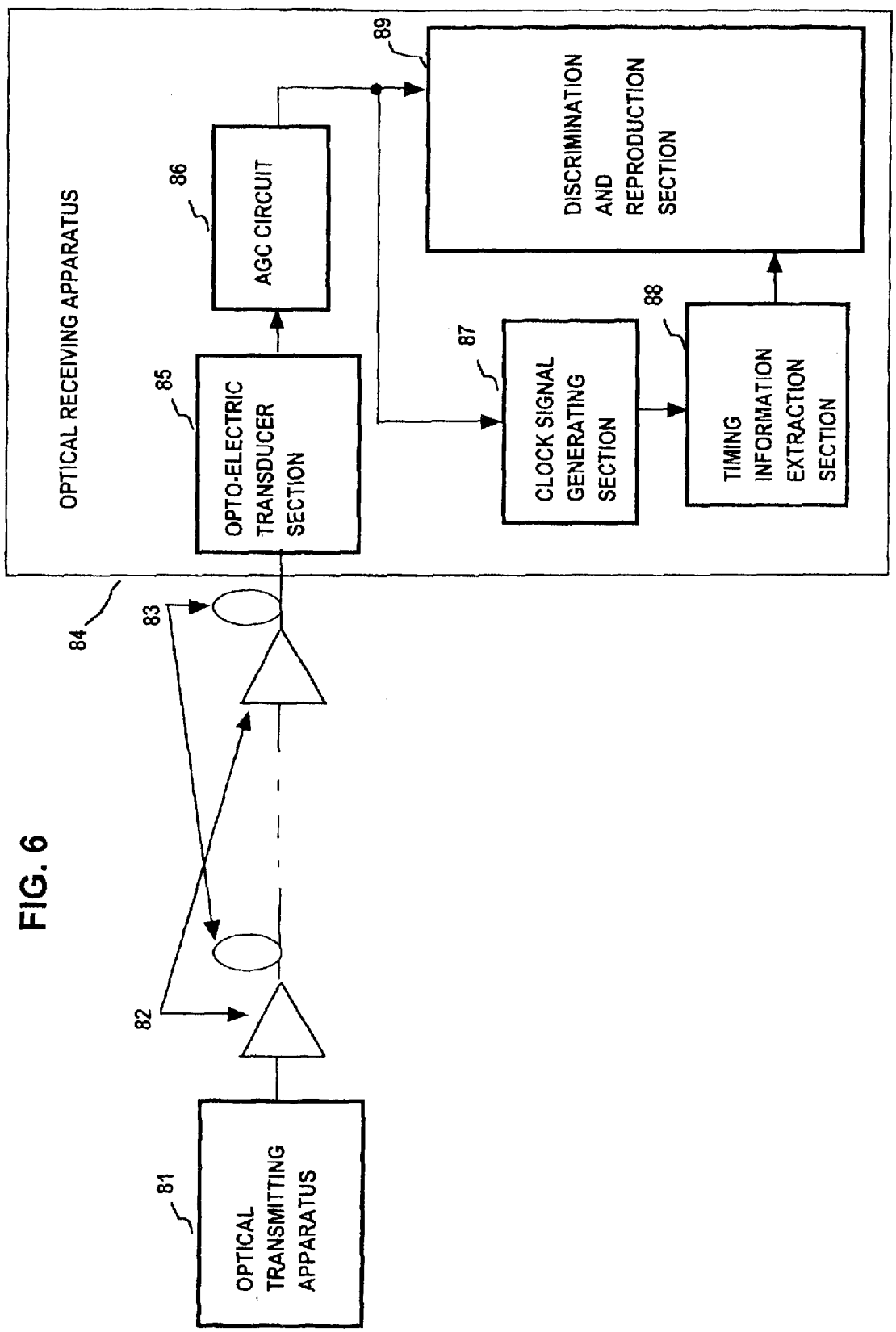
FIG. 6 is a system block diagram of an optical transmission system having an optical receiving apparatus incorporating an AGC circuit according to the present invention.

An example of an optical receiving apparatus and an optical transmission system which incorporate the first embodiment of an AGC circuit will be described referring to FIG. 6. In FIG. 6, the 84x is formed of an 85x, an 86x, an 87x, an 88x an 89x. The 85x converts a received optical signal to a pair of electrical signals, and supplies that signal pair to the 86x. The 86x produces a complementary controlled output signal pair, as described hereinabove, which are supplied to the 87x and the 89x. The 87x produces a regenerated control signal, derived from these output signals, and supplies that control signal to the 88x, which performs phase adjustment of the control signal. The 89x performs discrimination of the output signals from the 86x, based on the phase-adjusted control signal from the 88x.

The optical transmission system is formed of an 81x, which transmits an optical signal, an 82x which amplifies the output signal from the 81x, an 83x which transmits the optical signal that has been amplified by the 82x, and the 84x, which receives the optical signal that has been transmitted via the 83x.

The 84x incorporates an AGC circuit according to the first embodiment of the present invention described above, so that stability and high performance can be attained by the system configuration shown in FIG. 6.

Second Embodiment

Figure 7:
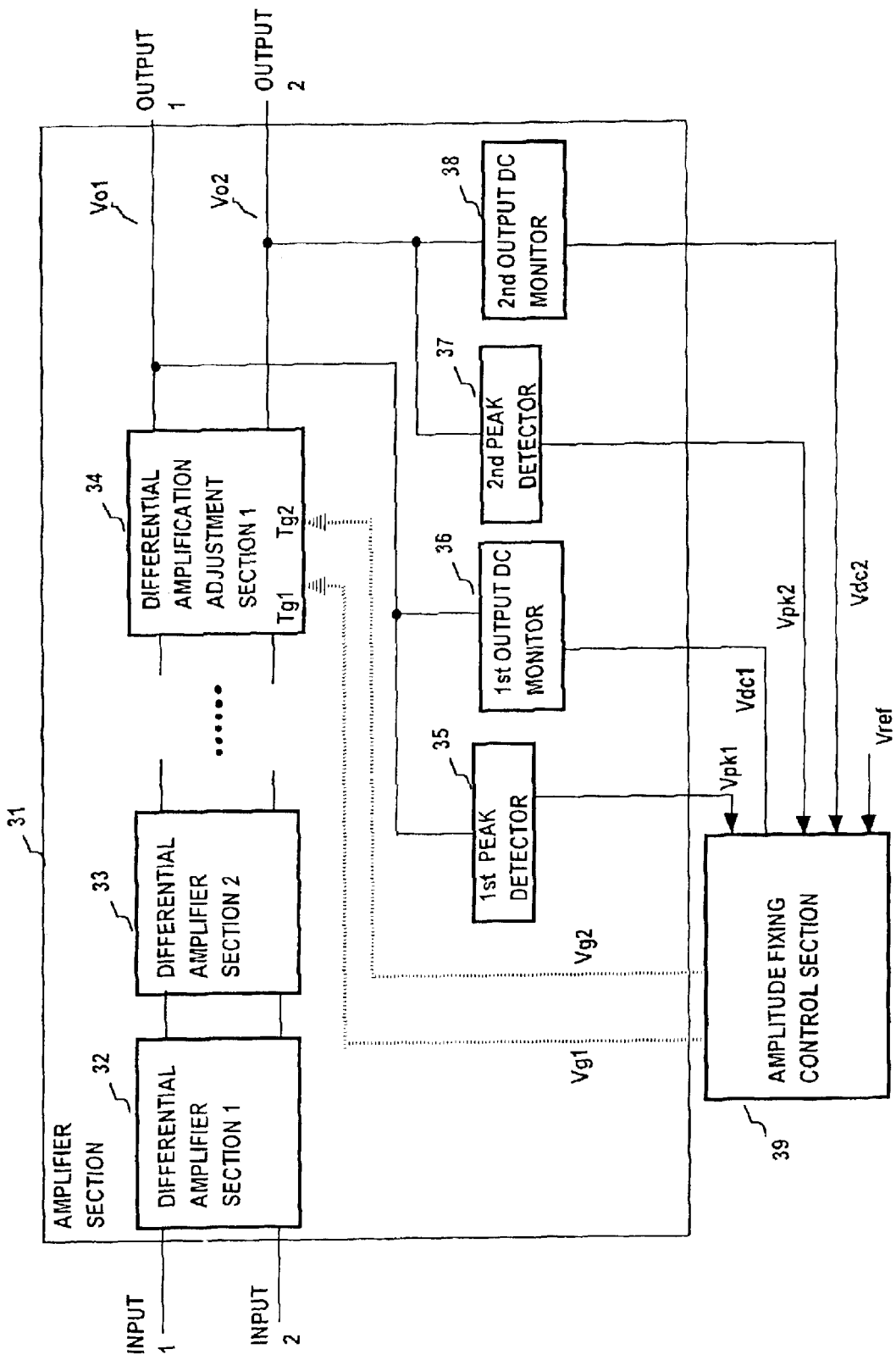
FIG. 7 is a general system block diagram of a second embodiment of an AGC circuit.
Figure 8A:
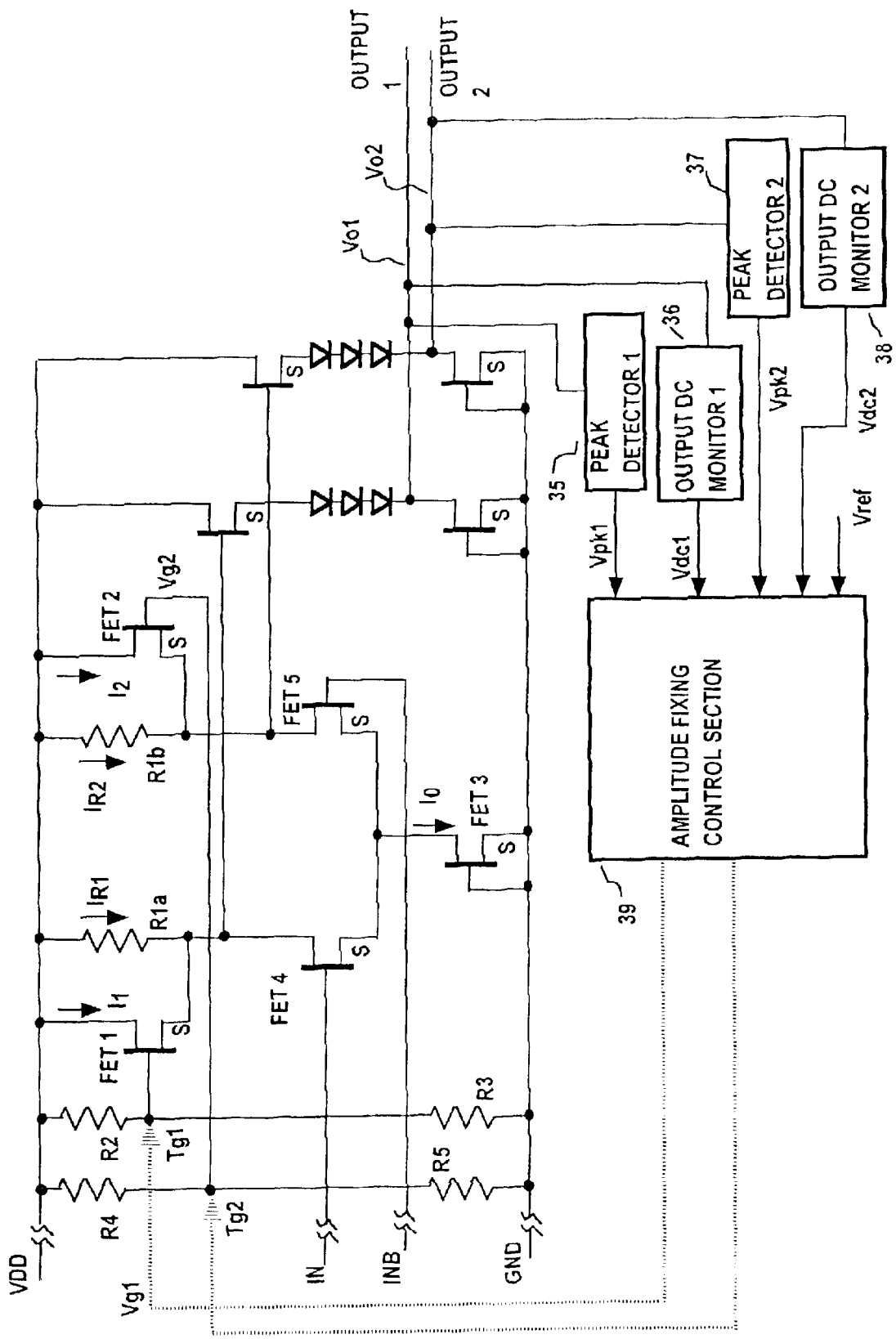

FIG. 7 is a general system block diagram of a second embodiment of an AGC circuit, and FIG. 8A shows an example of the circuit configuration of a differential amplification adjustment circuit section of this embodiment and its connection relationships to other system blocks. FIG. 8B shows corresponding signal waveforms.

With the first embodiment, the peak amplitude and DC component values of a specific one of the two controlled output signals Vo1, Vo2 are detected, and their difference is compared with an amplitude control reference voltage to thereby derive an amplitude control signal Vg which is applied to control the amplitude of that specific one of the output signals Vo1, Vo2 to a desired fixed value. With the second embodiment, that control is applied to both of the Vo1, Vo2 signals. In other respects, the operation of the second embodiment is substantially similar to that of the first embodiment.

Specifically, the AGC circuit of FIG. 7 is basically formed of an amplifier section 31 and an amplitude fixing control section 39. The amplifier section 31 is formed of a plurality of cascade-connected differential amplifier circuit sections 32, 33 etc., with the differential output signal from the final stage of that series of differential amplifier circuit sections being supplied to a differential amplification adjustment circuit section 34. The amplifier section 31 further includes a 1st peak detector circuit 35, a 1st output DC monitor circuit 46, a 2nd peak detector circuit 37 and a 2nd output DC monitor circuit 38.

A pair of input signals of the amplifier section 31, designated Input 1, Input 2 respectively, are supplied to the first stage 32 of the series of differential amplifier circuit sections. The 34x applies controlled amplification to the aforementioned differential output signal from the final stage, to produce first and second controlled output signals Vo1, Vo2.

The 1st peak detector circuit 35 detects the peak value of the 1st output signal Vo1, and supplies a corresponding detection signal Vpk1 to the amplitude fixing control section 39. Similarly the 2nd peak detector circuit 37 detects the peak value of the 2nd output signal Vo2, and supplies a corresponding detection signal Vpk2 to the amplitude fixing control section 39. The 1st output DC monitor circuit 46 detects the DC component value of the 1st output signal Vo1, and supplies a corresponding detection signal Vdc1 to the amplitude fixing control section 39. Similarly, the 2nd output DC monitor circuit 38 detects the DC component value of the 2nd output signal Vo2, and supplies a corresponding detection signal Vdc2 to the amplitude fixing control section 39.

The amplitude fixing control section 39 derives the difference between Vpk1 and Vdc1, with that difference value designated in the following as $\Delta Vo1$, and compares that difference value $\Delta Vo1$ with the amplitude control reference voltage Vref, with a first amplitude control signal Vg1 being generated in accordance with the result of the comparison, and supplied to a first input terminal Tg1 of the differential amplitude adjustment circuit section 24. The amplitude fixing control section 39 further derives the difference between Vpk2 and Vdc2, with that difference value designated in the following as $\Delta Vo2$, and compares that difference value $\Delta Vo2$ with the amplitude control reference voltage Vref. A second amplitude control signal Vg2 is generated in accordance with the result of that comparison, and supplied to a second input terminal Tg2 of the differential amplitude adjustment circuit section 24.

The value of Vref is set as one-half of the required value of amplitude for the output signals Vo1, Vo2. Since it can be understood from the above that an internal configuration for the amplitude fixing control section 39 can readily be envisaged, detailed description is omitted.

If either of $\Delta Vo1$ or $\Delta Vo2$>Vref, the corresponding one of the first and second amplitude control signals Vg1, Vg2 is set to a value such as to reduce the amplitude of the corresponding one of the output signals Vo1, Vo2. Similarly, if either of $\Delta Vo1$ or $\Delta Vo2$<Vref, then the corresponding one of the first and second amplifier control signals attains a value such as to increase the amplitude of the corresponding one of the output signals Vo1, Vo2. Such processing is repetitively executed until both $\Delta Vo1$, $\Delta Vo2$ are equal to Vref. The respective amplitudes of the controlled output signals Vo1, Vo2 from the amplifier section 31 are thereby held fixed at the required value.

Similarly to the first embodiment, the 34x of the second embodiment is configured internally such that an initial predetermined level of voltage is applied to each of the first and second input terminals Tg1, Tg2 when power is applied to the AGC circuit, and that thereafter each of the input terminals Tg1, Tg2 is set to a potential which is determined by the corresponding amplitude control signal, when that begins to be supplied from the amplitude fixing control section 39.

An example of the circuit configuration of the 34x, and its connection relationships to the amplitude fixing control section 39, the 1st peak detector circuit 35, 1st output DC monitor circuit 46, 2nd peak detector circuit 37 and 2nd output DC monitor circuit 38 will be described referring to FIG. 8A. The circuit includes a differential amplifier circuit formed of a FET 4 and FET 5, connected as a differential pair, having respective load resistors R1$a$, R1$b$ that are of identical value, and having a common-source connection to a current source FET 3. Current source FETs FET 1 and FET 2, having matched characteristics, are respectively connected in parallel with the load resistors R1$a$, R1$b$. The first amplitude control signal Vg1 from the amplitude fixing control section 39 is applied to the gate electrode of FET 1, while the second amplitude control signal is applied to the gate electrode of FET 2.

The gate electrodes of FET 1, FET 2 are also respectively connected to the junction of resistors R2, R3, and to the junction of resistors R4, R5, with each pair of resistors R2, R3 and R4, R5 being connected between the power supply voltage VDD and ground potential, for thereby applying the aforementioned initial levels of voltage to the gate electrodes of FET 1, FET 2 when power begins to be supplied to the AGC circuit.

Differential input signals (produced from the final stage of the aforementioned series of differential amplifier circuit sections 22, 23, etc.,) designated as IN and INB, are applied to the gate electrodes of FET 4 and FET 5 respectively.

Differential signals which are produced at the junction of FET 4 and load resistor R1$a$ and at the junction of FET 5 and load resistor R1$b$, respectively, are supplied to respective source-follower stages as shown, to be produced as the controlled output signals Vo1 and Vo2 of the AGC circuit.

In the amplitude fixing control section 39, the difference $\Delta$Vo1 between Vpk1 and Vdc1 is derived, and compared with Vref to produce the first amplitude control signal Vg1. Similarly, the difference $\Delta$Vo2 between Vpk2 and Vdc2 is derived, and compared with Vref to produce the second amplitude control signal Vg2. The respective values of current which flow in FET 1 and FET 2 are altered accordingly. Designating the value of current which flows in the current source FET 3 as I0, designating the current which flows in resistor R1$a$, connected in parallel with FET 1, as IR1, designating the current which flows in resistor R2$a$, connected in parallel with FET 2, as IR2, the value of each of R1$a$ and R1$b$ as r1, and designating the respective currents which flow in FET 1, FET 2 as I1, I2, the following is true:

$$I0 = IR1 + IR2 + I1 + I2 \quad (7)$$

Hence, designating the maximum amplitudes of the differential output signals produced from the differential circuit as VL1 and VL2, $$VL1 = 2 \times r1 \times IR1 \quad (8)$$

$$VL2 = 2 \times r1 \times IR2 \quad (9)$$

With this configuration, if either of $\Delta$Vo1 or $\Delta$Vo2>Vref, the corresponding one of the first and second amplitude control signals Vg1, Vg2 is set to a value such as to increase the value of the corresponding current I1 or I2 and thereby reduce the value of the corresponding current IR1 or IR2, to thereby decrease the amplitude of the corresponding output signal Vo1 or Vo2. Conversely, if either of $\Delta$Vo1 or $\Delta$Vo2<Vref, the corresponding one of the first and second amplitude control signals Vg1, Vg2 is set to a value such as to decrease the value of the corresponding current I1 or I2 and thereby increase the value of the corresponding current IR1 or IR2 and thereby increase the amplitude of the corresponding output signal Vo1 or Vo2. These operations occur repetitively, until $\Delta$Vo1 and $\Delta$Vo2 become equal to Vref.

The respective amplitudes of each of the output signals Vo1, Vo2 from the AGC circuit are thereby held fixed at the required value, as illustrated in FIG. 8B.

It should be noted that it would be equally possible to use the differential amplification adjustment circuit sections shown in FIG. 3 to constitute the 34$x$, with the second embodiment. In that case, the control operation applied by the 34$x$ would be similar to that described above for the functioning of the circuit of FIG. 3 when used with the first embodiment, however with the second embodiment, the control operation is applied to both of the output signals Vo1, Vo2 of the AGC circuit.

An alternative configuration of the second embodiment will be described referring to the general system block diagram of FIG. 9. With this configuration, the amplifier section 31 contains a series of n cascade-connected differential amplification adjustment circuit sections 132, 133, . . . , 134, where n is a plural integer. The connections of the 134$x$ to the 1st peak detector circuit 35, 1st output DC monitor circuit 46, 2nd peak detector circuit 37 and 2nd output DC monitor circuit 38, and the functioning of these, are as described for the 34$x$ in the configuration shown in FIG. 9, so that detailed description will be omitted.

Figure 9:
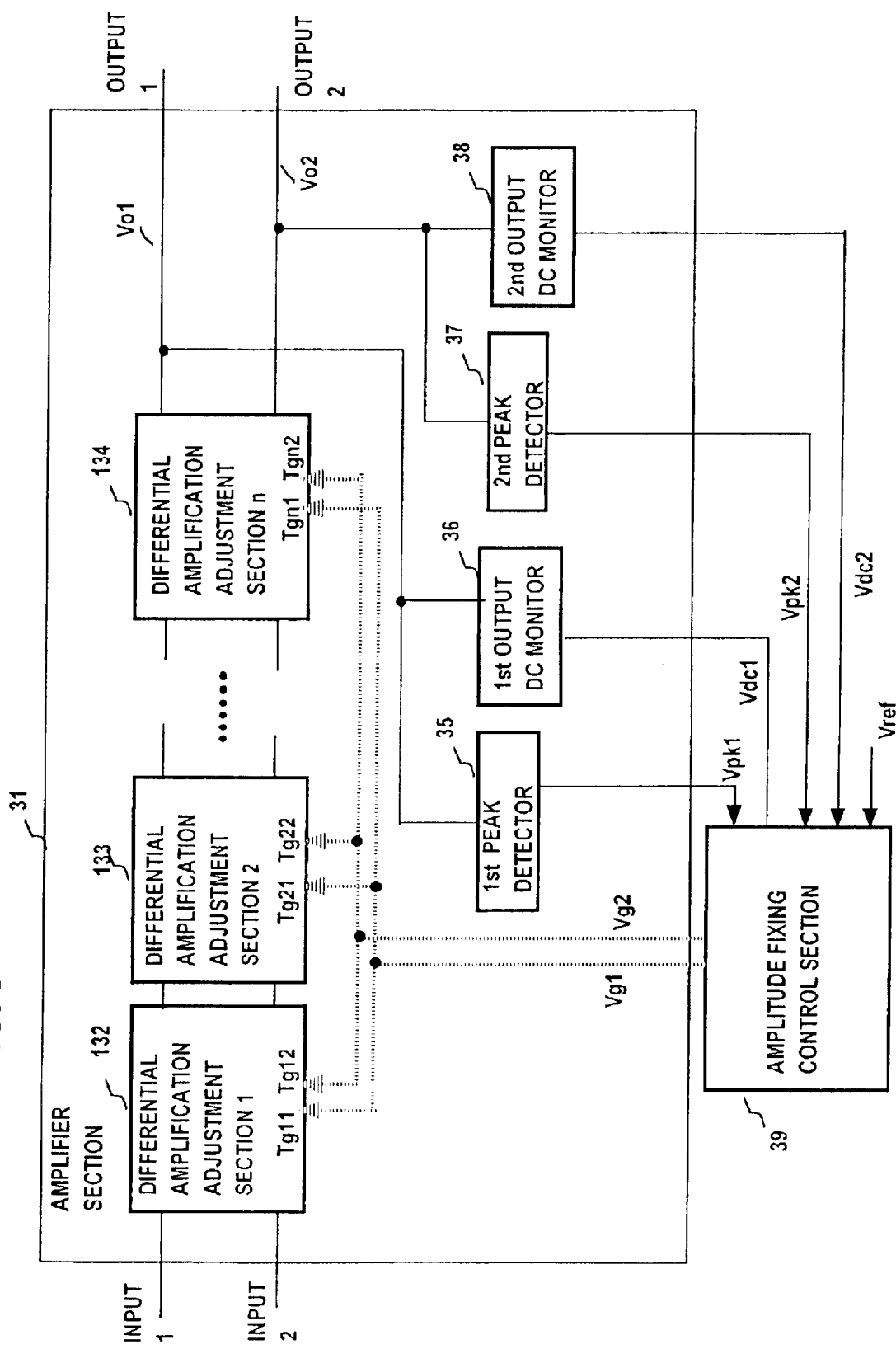
FIG. 9 is a general system block diagram of an alternative configuration of the second embodiment.

Each of the differential amplification adjustment circuit sections of the AGC circuit shown in FIG. 9 can be configured as shown in FIG. 2 or FIG. 3 (modified to receive two amplitude control signals Vg1, Vg2, as described for FIG. 8A).

With this configuration, the input signal pair Input 1, Input 2 are supplied to the first stage 132 of the series of n differential amplification adjustment circuit sections 132, 132, . . . , 134. The final stage 134 of that series operates in the same manner as the 34$x$ in the configuration of FIG. 7, described above, i.e., applying controlled amplification to the pair of differential output signals from the preceding one of the series of differential amplification adjustment circuit sections, to produce first and second controlled output signals Vo1, Vo2. The 1st peak detector circuit 35 detects the peak value of the 1st output signal Vo1, and supplies a corresponding detection signal Vpk1 to the amplitude fixing control section 39, while the 2nd peak detector circuit 37 detects the peak value of the 2nd output signal Vo2, and supplies a corresponding detection signal Vpk2 to the amplitude fixing control section 39. The 1st and 2nd output DC monitor circuits detect the respective DC component values of the 1st and 2nd output signals Vo1, Vo2 respectively, and supply corresponding detection signals Vdc1, Vdc2 to the amplitude fixing control section 39.

The amplitude fixing control section 39 derives the difference $\Delta$Vo1 between Vpk1 and Vdc1, and compares that difference value $\Delta$Vo1 with the amplitude control reference voltage Vref, with a first amplitude control signal Vg1 being generated in accordance with the result of the comparison and supplied to respective input terminals Tg11, Tg21, . . . , Tgn1 (i.e., each corresponding to the input terminal Tg1 of FIGS. 7 and 8) of the differential amplification adjustment sections 132, 133, . . . , 134. The amplitude fixing control section 39 further derives the difference $\Delta$Vo2 between Vpk2 and Vdc2, and compares that difference value $\Delta$Vo2 with the amplitude control reference voltage Vref to thereby derive the second amplitude control signal Vg2, which is supplied to respective input terminals Tg12, Tg22, . . . , Tgn2 (i.e., each corresponding to the input terminal Tg2 of FIGS. 7 and 8) of the differential amplification adjustment sections 132, 133, . . . , 134.

The operation of the amplitude fixing control section 39 is identical to that described for the configuration of FIG. 7. That is to say, the value of Vref is set as one-half of the required value of amplitude for the output signals Vo1, Vo2 produced from the 134x, and if either of ΔVo1 or ΔVo2>Vref, the corresponding one of the first and second amplitude control signals Vg1, Vg2 is set to a value such as to reduce the amplitude of the corresponding one of the output signals Vo1, Vo2, while if either of ΔVo1 or ΔVo2<Vref then the corresponding one of the control signals Vg1, Vg2 attains a value such as to increase the amplitude of the corresponding one of the output signals Vo1, Vo2. The respective amplitudes of the controlled output signals Vo1, Vo2 from the amplifier section 31 are thereby held fixed at the required value.

As described for the 34x of FIG. 7, each of the differential amplification adjustment sections 132, 133, . . . , 134 is configured internally such that an initial predetermined level of voltage is applied to each of the first and second input terminals which are coupled to receive the amplitude control signals Vg1, Vg2, when power is applied to the AGC circuit, and that thereafter each of these input terminals is set to a potential which is determined by the corresponding amplitude control signal Vg1 or Vg2 when that begins to be supplied from the amplitude fixing control section 39.

With this configuration of the second embodiment the dynamic range of input signal amplitude, for the input signals Input 1, Input 2, can be n times that of the configuration of the second embodiment which is shown in FIG. 7.

It can thus be understood that with the second embodiment described above, peak levels of the first and second output signals Vo1, Vo2 are detected by first and second peak detector circuits 35 and 37 respectively, while the respective DC components of these output signals are detected by first and second output DC monitor circuits 37, 38. The resultant four signals are supplied to the amplitude fixing control section 39, which thereby generates first and second amplitude control signals whereby the first and second output signals Vo1, Vo2 are held at fixed values, with these amplitude control signals being supplied to input terminals of each of a plurality of cascade-connected differential amplification adjustment circuit sections. A pair of controlled output signals are thereby produced at respective fixed amplitudes, irrespective of variations in the input signal levels applied to the AGC circuit.

As can be understood from the description of FIG. 8, each of the differential amplification adjustment circuit sections can have a simple circuit configuration, so that the supply voltage requirements for operating such an AGC circuit can be reduced, by comparison with the prior art.

The second embodiment can be advantageously incorporated into an optical receiving apparatus and an optical transmission system such as that of FIG. 6, to achieve stability and high performance.

Third Embodiment

A third embodiment will be described, referring to the AGC circuit shown in block diagram form in FIG. 10, and to the specific circuit configurations and waveform diagrams of FIGS. 11A, 11B, and 12 to 14. It should be understood that the contents of these diagrams are intended only to illustrate the features and operation of the embodiment, and are not to be understood as limiting the embodiment.

In the following, only features which differ from those of the preceding embodiments are described.

Figure 10:
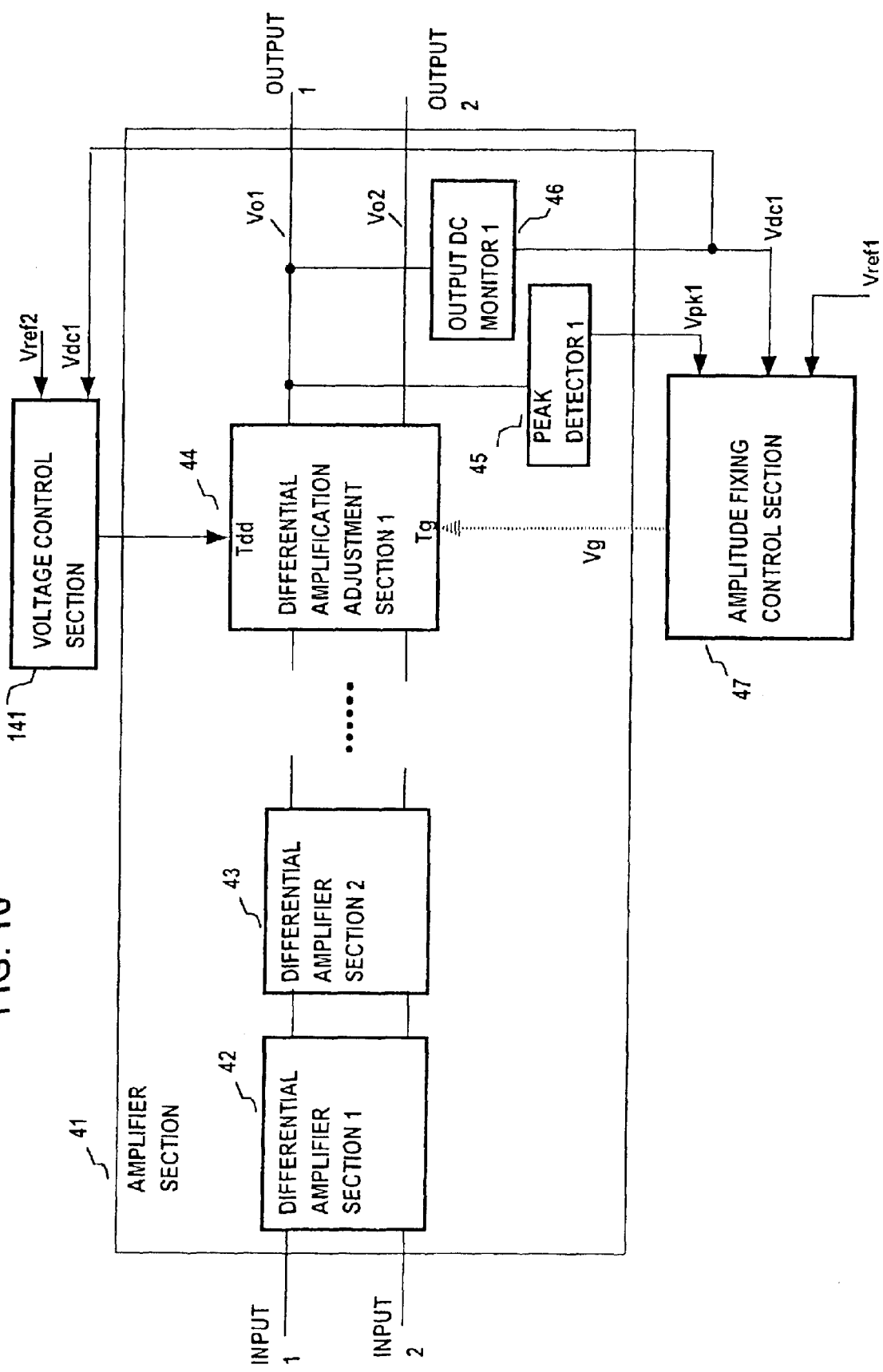
FIG. 10 is a general system block diagram of a third embodiment of an AGC circuit.

As shown in FIG. 10, this embodiment is formed of an amplifier section 41, an amplitude fixing control section 47, and a voltage control section 141. The amplifier section 41 is formed of a series of cascade-connected differential amplifier sections 42, 43, . . . , with the input signals Input 1, Input 2 being supplied to the first-stage differential amplifier section 42, and the output signals from a final stage of that series of differential amplifier sections being supplied to a differential amplitude adjustment circuit section 44. The amplifier section 41 further includes a peak detector circuit 45 and peak detector circuit 45, each coupled to receive the output signal Vo1 from the differential amplitude adjustment circuit section 44, and supply respective output signals Vpk1 and Vdc1 to the amplitude fixing control section 47, with the amplitude fixing control section 47 deriving the amplitude control signal Vg based on the detection signals Vpk1 and Vdc1 and on a first reference voltage Vref1 which is supplied thereto, as described for the preceding embodiment of FIG. 1, with the amplitude control signal Vg being supplied to input terminal Tg of the differential amplitude adjustment circuit section 44. The complementary output signals Vo1, Vo2 produced from the differential amplitude adjustment circuit section 44 constitute the output signals Output 1, Output 2 of the amplifier section 41.

The amplitude control signal Vg operates on the differential amplitude adjustment circuit section 44 to control the amplitude of the output signal Vo1 to a fixed value, as determined by the value of the reference voltage Vref1, in a similar manner to that described for the differential amplitude adjustment circuit section 24 of the embodiment of FIG. 1.

The detection signal Vdc1 from the output DC monitor circuit 46 is supplied to the voltage control section 141 together with a second reference voltage Vref2, and the voltage control section 141 derives the difference ΔVdc between these. A controlled supply voltage, designated in the following as VDD', is produced from the voltage control section 141 and applied to a control input terminal Tdd of the differential amplitude adjustment circuit section 44, for acting on the differential amplitude adjustment circuit section 44 such as to reduce the magnitude of the difference ΔVdc, as described hereinafter. That is to say, the value of the reference voltage Vref2 is that of the required value of DC component of the output signal Vo1 produced from the differential amplitude adjustment circuit section 44.

The voltage control section 141 is provided with an internal circuit whereby an initial value of the controlled supply voltage VDD' is established when power begins to be supplied to the AGC circuit, with that initial value continuing until the detection signal Vdc1 begins to be supplied from the output DC monitor circuit 46. Thereafter, the value of the controlled supply voltage is determined based on the aforementioned difference ΔVdc as described above.

Figure 11A:
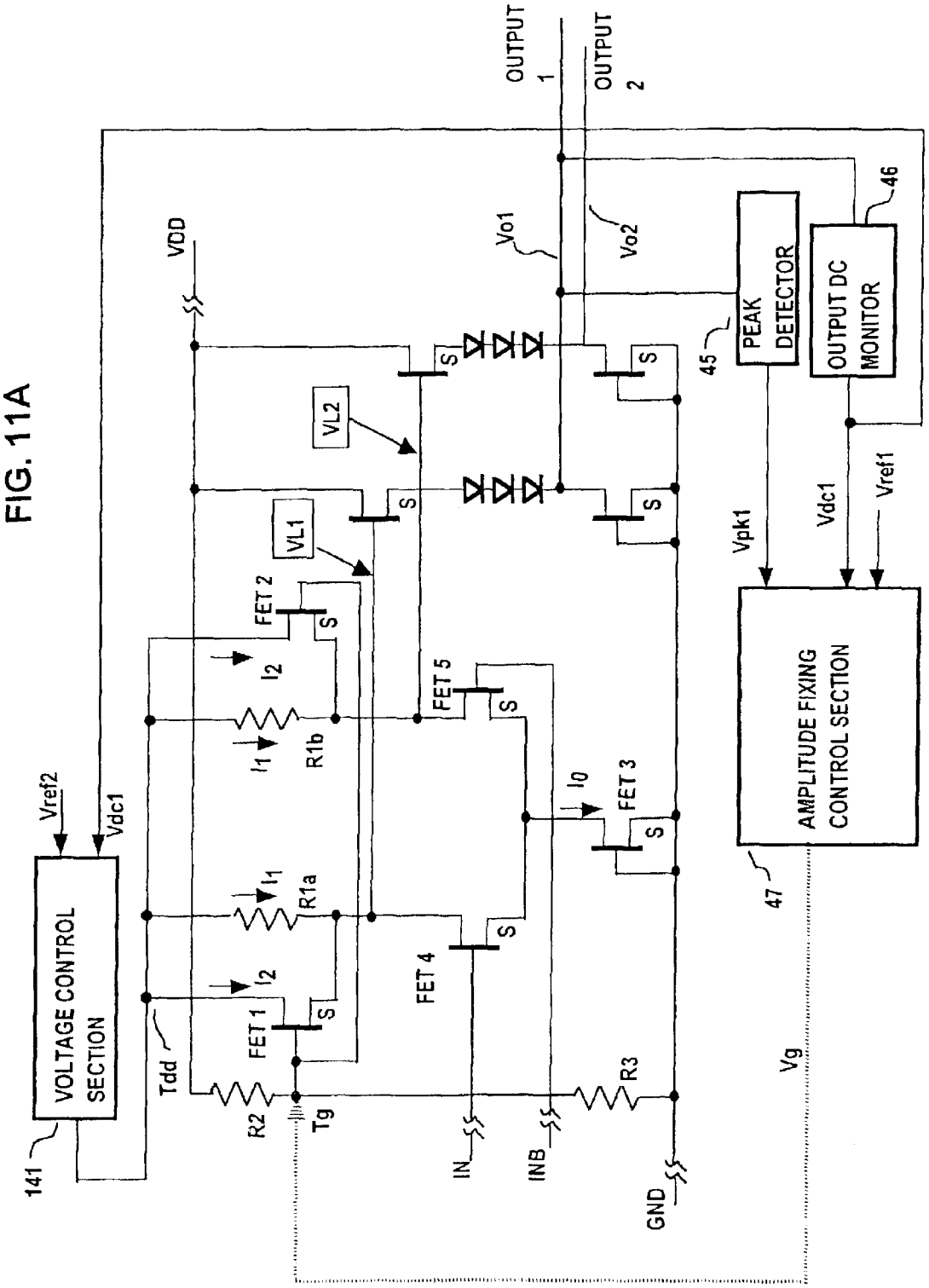
FIG. 11A is a circuit diagram showing the internal configuration of a differential amplification adjustment circuit section in the third embodiment, and showing connections to peripheral circuit sections.

FIG. 11A shows a specific example of a circuit configuration for the differential amplitude adjustment circuit section 44 of this embodiment, and the connection relationships of that circuit to the peak detector circuit 45, the output DC monitor circuit 46 the amplitude fixing control section 47 and the voltage control section 141. This circuit differs from that of FIG. 2A described hereinabove only with regard to the function of the voltage control section 141, in applying the controlled supply voltage to the control input terminal Tdd and hence to the drain electrodes of FET 1 and FET 2 and to the load resistors R1a, R1 of the differential pair of FETs 4 and 5 respectively. That is to say, while the value of the controlled supply voltage VDD' is constant, the operation of the circuit of FIG. 11A is identical to that of the circuit of FIG. 2A, with the levels of currents I2 which flow in FET 1, FET 2 being controlled by the level of the control signal Vg from the amplitude fixing control section 47 such as to maintain the amplitude of the output signal Vo1 at a constant value, determined by the value of the first reference voltage Vref1. In addition, the function of the resistors R2, R3 in establishing an initial value of control signal Vg when power begins to be applied to the AGC circuit is identical to that described for the circuit of FIG. 2A.

The following is true for the circuit of FIG. 11A:

$$I0 = I1 + I2 \tag{10}$$

Designating r1 as the value of each of the load resistors R1a, R1b, the maximum amplitudes VL1, VL2 of the output signals from the differential circuit, developed across the load resistors R1a, R1b respectively, are expressed as:

$$VL1(VL2) = 2 \times r1 \times I1 \tag{11}$$

However with the circuit of FIG. 11A, when the difference ΔVdc between the detection signal Vdc1 and the second reference voltage Vref2 is derived, the controlled supply voltage VDD' is generated, by adjusting the supply voltage VDD by an amount which is based on the difference ΔVdc, and supplied to the control input terminal Tdd. This process is repeated until the value of the detection signal Vdc1 becomes identical to the second reference voltage Vref2. Hence, $$VDD' = VDD \pm \Delta Vdc \tag{12}$$

Figure 11B:
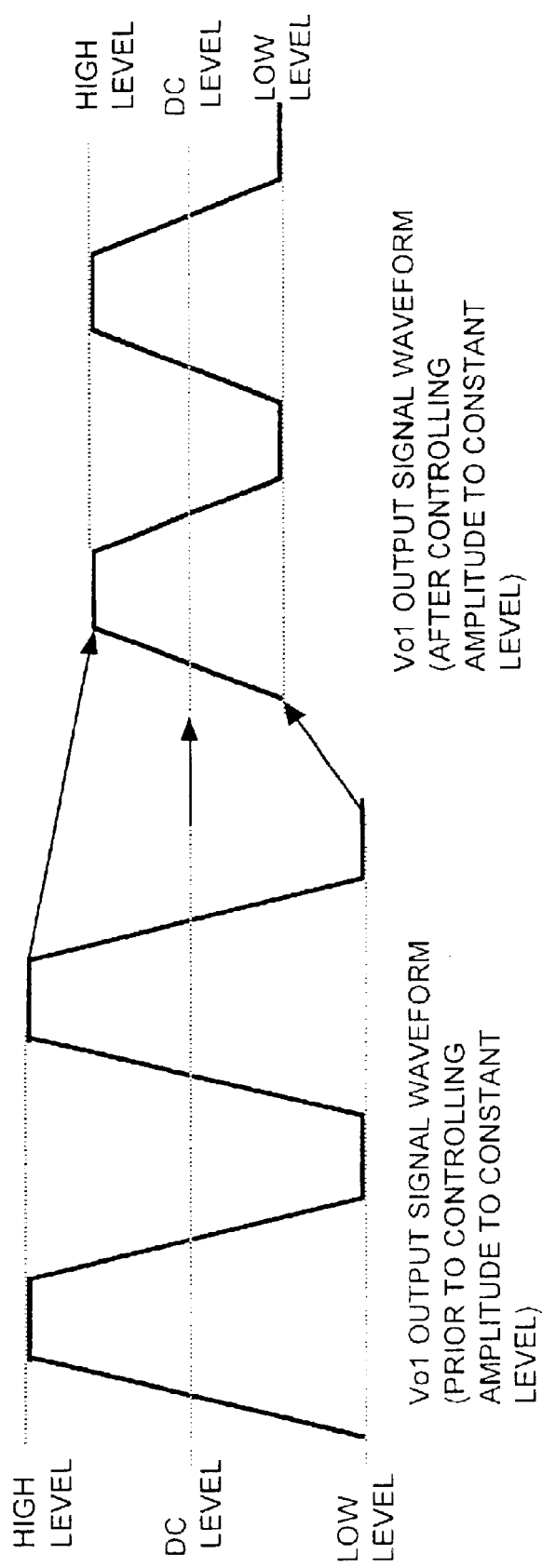
FIG. 11B is a corresponding waveform diagram.

As a result, as illustrated by the waveform diagram of FIG. 11B, in addition to the amplitude of the output signal Vo1 being controlled to be held at a fixed value which is determined by the reference voltage Vrer1, the level of the DC component of the output signal Vo1 is also held at a fixed value, determined by the reference voltage Vref2.

Figure 12:
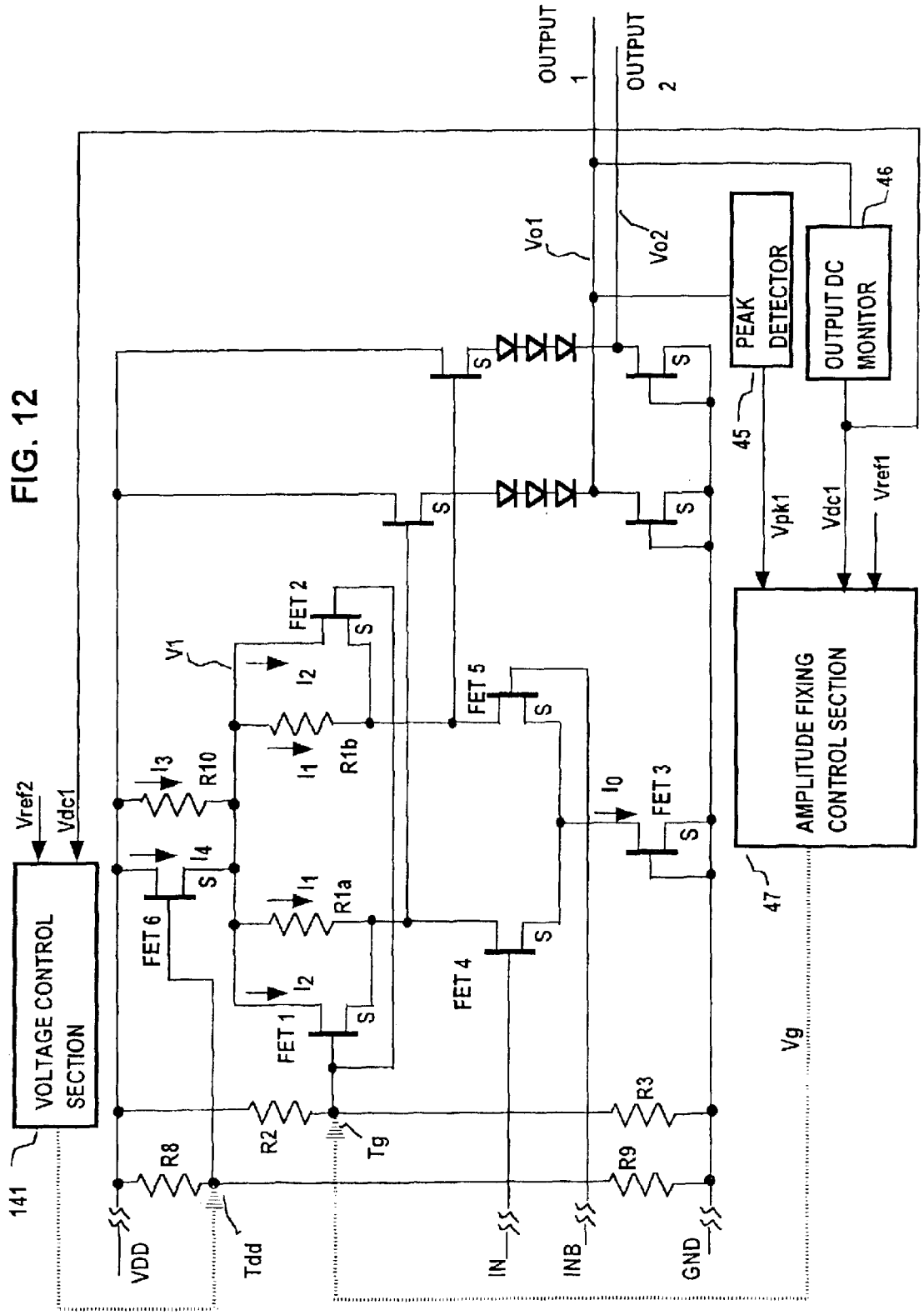
FIG. 12 is a circuit diagram showing a second example of the internal configuration of a differential amplification adjustment circuit section in the third embodiment, and showing connections to peripheral circuit sections.

FIG. 12 shows another example of a circuit configuration for the differential amplitude adjustment circuit section 44 of the third embodiment, and the connection relationships of that circuit to the peak detector circuit 45, the output DC monitor circuit 46 the amplitude fixing control section 47 and the voltage control section 141. This circuit differs from that of FIG. 11A described above in that, instead of the controlled supply voltage VDD' being supplied directly from the voltage control section 141, the supply voltage VDD is supplied to the drain electrodes of FETs 1 and 2 and to the load resistors R1a, R1b of the differential FET pair 4, 5 via a resistor R10 which functions as a voltage control resistor, and a FET 6, which are connected in parallel. The proportion of the load current (i.e., the current I0 which flows in the current source FET 3 of the differential transistor pair of FETs 4, 5) that passes through the voltage control resistor R10 as the current I3 and thereby determines the amount of voltage drop across the resistor R10 and so determines the effective value of supply voltage that is applied to the differential circuit, is determined by the current I4 which flows in the FET 6. That current I4 is determined by a DC level control signal which is produced by the voltage control section 141, in accordance with the aforementioned difference ΔVdc between the detection signal Vdc1 and the second reference voltage Vref2, and which is applied to the input control terminal Tdd as shown, and hence to the gate electrode of the FET 6.

The relation between the current I0 which is passed by the current source FET 3 of the differential FET pair 4, 5 and the currents I1, I2, I3, I4 can be expressed as:

$$I0 = 2 \times (I1 + I2) = I3 + I4 \tag{13}$$

Designating V1 as the value of supply voltage which is thereby applied to the drain electrodes of FETs 1 and 2 and to the load resistors R1a, R1b of the differential FET pair 4, 5, and the value of the resistor R10 as r2, V1 is obtained as:

$$V1 = VDD - I3 \times r2 \tag{14}$$

It can thus be understood that this circuit provides the same effects as that of the circuit of FIG. 11A. That is to say, the level of the control signal which is supplied from the voltage control section 141 to the input control term Tdd varies, in accordance with the value of the difference ΔVdc, such as to adjust the current flow I4 through the FET 6 and accordingly the current I3 through the resistor F2. The level of the aforementioned voltage V1 is thereby adjusted, so that the DC component of the signal appearing at the drain electrode of FET 4 (and hence the DC component of the output signal Vo1) is correspondingly adjusted, in a direction whereby ΔVdc is reduced towards zero.

When power begins to be supplied to the AGC circuit, a voltage which is developed at the junction of the voltage divider formed by resistors R8, R9 is applied to the input control terminal Tdd, thereby setting the initial value of the DC component of the output signal Vo1 to an appropriate level. When the aforementioned control signal begins to be produced from the voltage control section 141, the potential of the input control terminal Tdd becomes determined only by that control signal.

Figure 13:
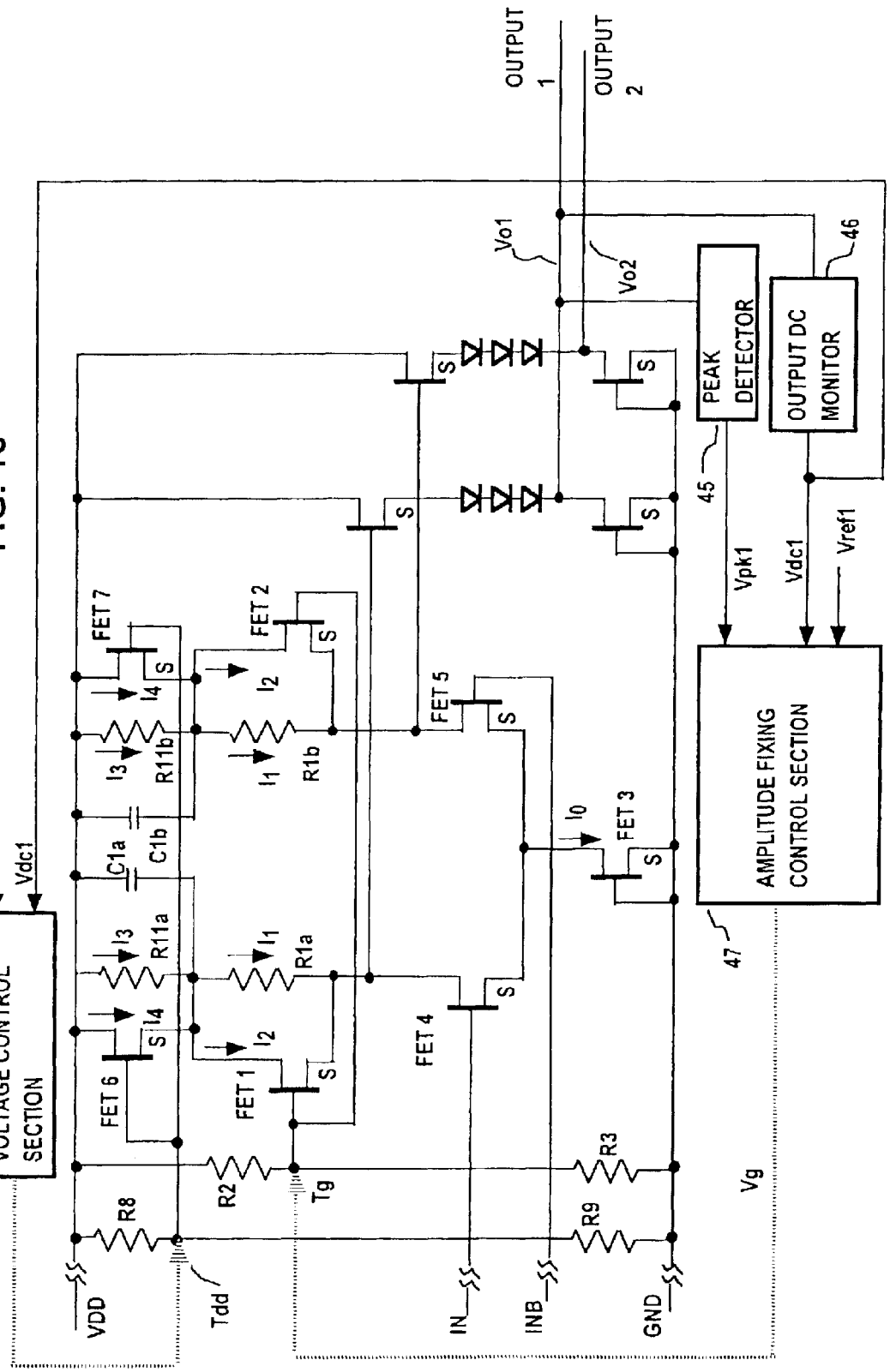
FIG. 13 is a circuit diagram showing a third example of the internal configuration of a differential amplification adjustment circuit section in the third embodiment, and showing connections to peripheral circuit sections.

FIG. 13 shows another example of a circuit configuration for the differential amplitude adjustment circuit section 44 of the third embodiment, and the connection relationships of that circuit to the peak detector circuit 45, the output DC monitor circuit 46 the amplitude fixing control section 47 and the voltage control section 141. This circuit differs from that of FIG. 11A described above in that, instead of the controlled supply voltage VDD' being supplied directly from the voltage control section 141, the supply voltage VDD is supplied to the drain electrode of FET 1 and the load resistor R1a of FET 1 via a resistor R11a and a FET 6 which are connected in parallel, and is supplied to the drain electrode of FET 2 and the load resistor R1b of FET via a resistor R11b and a FET 7 which are connected in parallel. The proportion of the load current (i.e., the current I0 which flows in the current source FET 3 of the differential transistor pair of FETs 4, 5) that passes through each of the resistors R11a, R11b, as the current I3, is determined by the current I4 which flows in each of the FETs 6 and 7. That current I4 is determined by a DC level control signal which is produced by the voltage control section 141, in accordance with the aforementioned difference ΔVdc between the detection signal Vdc1 and the second reference voltage Vref2, and which is applied to the input control terminal Tdd as shown, and hence to the gate electrodes of the FETs 6 and 7 respectively.

The FETs 6 and 7 are selected to have matched characteristics, so that a substantially identical level of current I4 flows in each of these, while the resistors R11a and R11b similarly have identical values so that an identical level of current I3 flows in each of these.

By-pass capacitors C1a, C1b are connected in parallel with the FETs 6 and 7 respectively, so that the AC load impedance of each of the transistors 4, 5 is unaffected by variations in the drain-source impedances of the FETs 6 and 7.

The relation between the current I0 which is passed by the current source FET 3 of the differential FET pair 4, 5 and the currents I1, I2, I3, I4 can be expressed as:

$$I0 = 2 \times (I1 + I2) = 2 \times (I3 + I4) \tag{15}$$

Designating V1 as the value of supply voltage which is thereby applied to the drain electrode of FET 1 and the load resistor R1a, and V2 as the value of supply voltage which is applied to the drain electrode of FET 2 and to the load resistors R1b of the differential FET pair 4, 5, and designating the value of each of R11a, R11b as r2, V1 and V2 can be respectively obtained as:

$$V1 = VDD - I3 \times r2 \quad (16)$$

$$V2 = VDD - I3 \times r2 \quad (17)$$

It can thus be understood that this circuit provides the same effects as that of the circuit of FIG. 11A. That is to say, the level of the control signal which is supplied from the voltage control section 141 to the input control term Tdd varies, in accordance with the aforementioned difference ΔVdc between Vdc1 and Vref2, such as to adjust the current flow I4 through the FETs 6 and 7, and accordingly the current flow I3 through the resistors R11a and R11b. The levels of the aforementioned voltages V1 and V2 are each thereby adjusted, so that the DC component of the signal appearing at the drain electrode of FET 4 (and hence the DC component of the output signal Vo1) is correspondingly adjusted, in a direction whereby ΔVdc is reduced towards zero.

Figure 14:
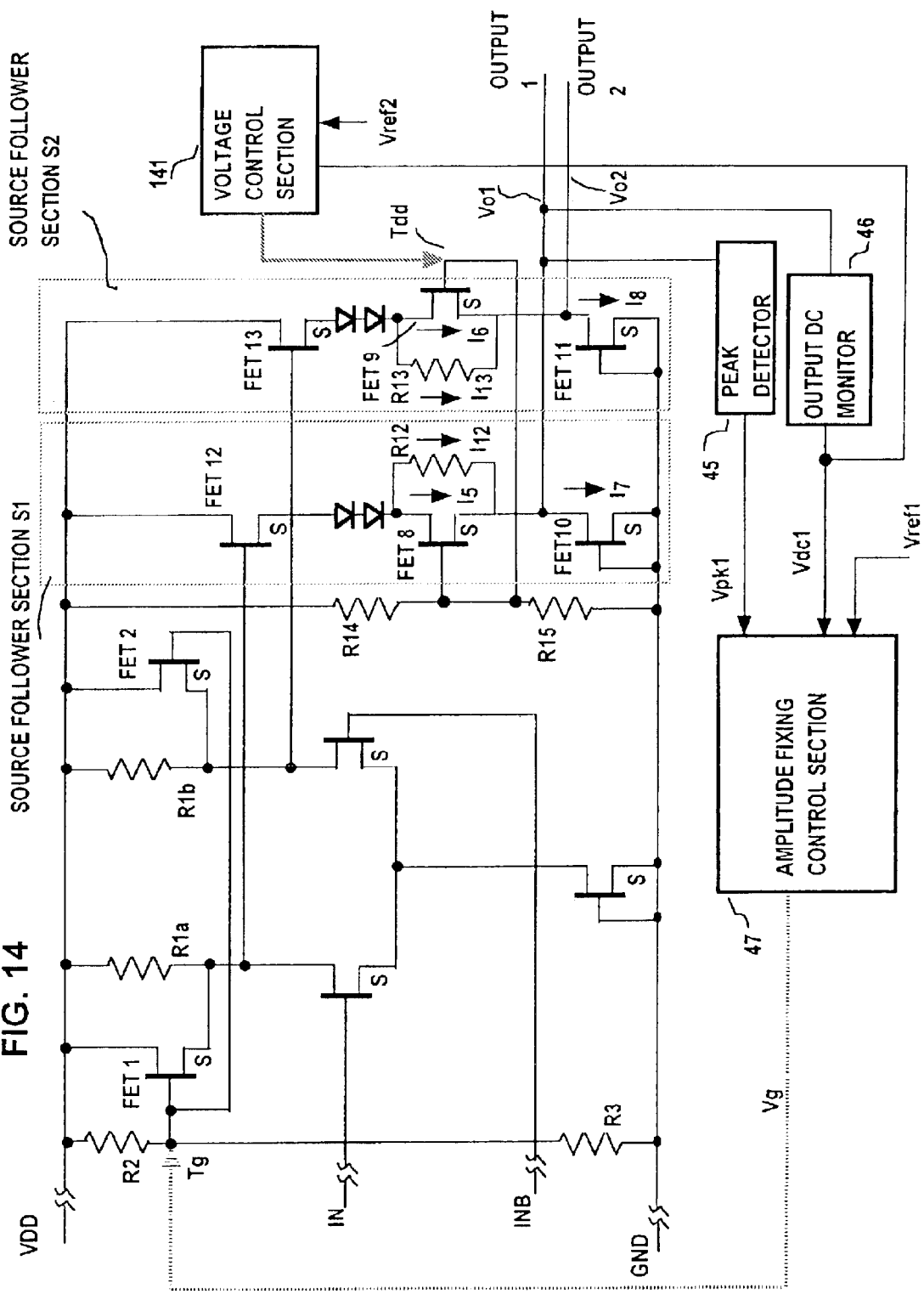
FIG. 14 is a circuit diagram showing a fourth example of the internal configuration of a differential amplification adjustment circuit section in the third embodiment, and showing connections to peripheral circuit sections.

FIG. 14 shows another example of a circuit configuration for the differential amplitude adjustment circuit section 44 of the third embodiment, and the connection relationships of that circuit to the peak detector circuit 45, the output DC monitor circuit 46 the amplitude fixing control section 47 and the voltage control section 141. This circuit differs from that of FIG. 11A described above in that, instead of controlling the supply voltage of the differential circuit which performs a signal amplitude control function based on the amplitude control signal Vg as described hereinabove, the DC level at the drain electrode of a current source FET in each of respective source follower output circuits, which produce the aforementioned output signals Vo1, Vo2, is directly controlled.

In FIG. 14, first and second output signals which are produced from the differential circuit, developed across the load resistors R1a, R1b respectively, are supplied to the gate electrodes of a FET 12 in a source follower circuit section S1 and a FET 13 in a source follower circuit section S2 respectively. The source follower circuit section S1 is formed of the FET 12, a parallel combination of a FET 8 and a resistor R12, and a current source FET 10, which are successively connected in series between the supply voltage VDD and ground potential as shown. The source follower circuit section S2 is formed of the FET 12, a parallel combination of a FET 8 and a resistor R12, and a current source FET 10, successively connected in series between the supply voltage VDD and ground potential.

The voltage control section 141 produces a DC level control signal, derived based on the aforementioned difference ΔVdc between the detection signal Vdc1 and the second reference voltage Vref2, with that control signal being applied via an input control terminal Tdd to the respective gate electrodes of the FETs 8 and 9.

An initial value of DC level control signal is applied to the gate electrodes of FETs 8, 9 when power is applied to the circuit, by the resistive voltage divider formed of resistors R14, R15.

In the source follower circuit section S1, assuming the amplitude control signal Vg to have a fixed value so that the DC component of the signal that appears across the load resistor R1a is constant, the DC component of the output signal Vo1 which appears at the current source FET 10 will vary in proportion to the value of current I12 which flows through the resistor R12. The value of I12 is determined by the value of the by-pass current I5 which flows through the FET 8, and so is determined by the value of the DC level control signal. Similarly under that condition, the DC component of the output signal which appears at the current source FET 11 will vary in proportion to the value of current I13 which flows through the resistor R13. The value of I13 is determined by the value of the by-pass current I6 which flows through the FET 9, and so is determined by the value of the DC level control signal. Hence, the respective values of these DC components of the output signals produced from the AGC circuit are adjusted in accordance with the DC level control signal that is supplied from the voltage control section 141 to the gate electrodes of the FETs 8 and 9 respectively, with that adjustment being made in a direction whereby the aforementioned difference ΔVdc between the detection signal Vdc1 and the second reference voltage Vref2 is brought towards zero.

In that way, feedback control is applied whereby the level of the DC component of the output signal Vo1 is fixed to be identical to the reference voltage Vref2, since the DC level control signal is derived based on detecting the DC component of that output signal Vo1, as described for the circuit of FIG. 11A.

In addition (assuming the FETs 8, 9 to have precisely matched characteristics, the FETs 10, 11 to have precisely matched characteristics, the resistors R12, R13 to be of identical value, and components such as R1a, R1b, FET 1, FET 2 in the differential amplifier circuit to be similarly precisely matched) the level of the DC component of the output signal which is produced as Output 2 will be held at a value which is substantially identical to the reference voltage Vref2.

Assuming such precise matching to be the case, the following relationship exists between I5, I6, I12, I13, and the currents I7, I8 which flow in the current source FETs 10, 11 respectively:

$$I7 = I12 + I5 = I6 + I13 = I8 \quad (18)$$

In the above description of the circuit examples of FIGS. 11, 12, 13 and 14, for the differential amplitude adjustment circuit section 44 of the third embodiment, the differential circuit which applies amplitude control based on the amplitude control signal Vg is assumed to be configured as shown in FIG. 2. However it would be equally possible to configure that differential circuit as shown in either of the examples of FIG. 3 or FIG. 4.

Figure 15:
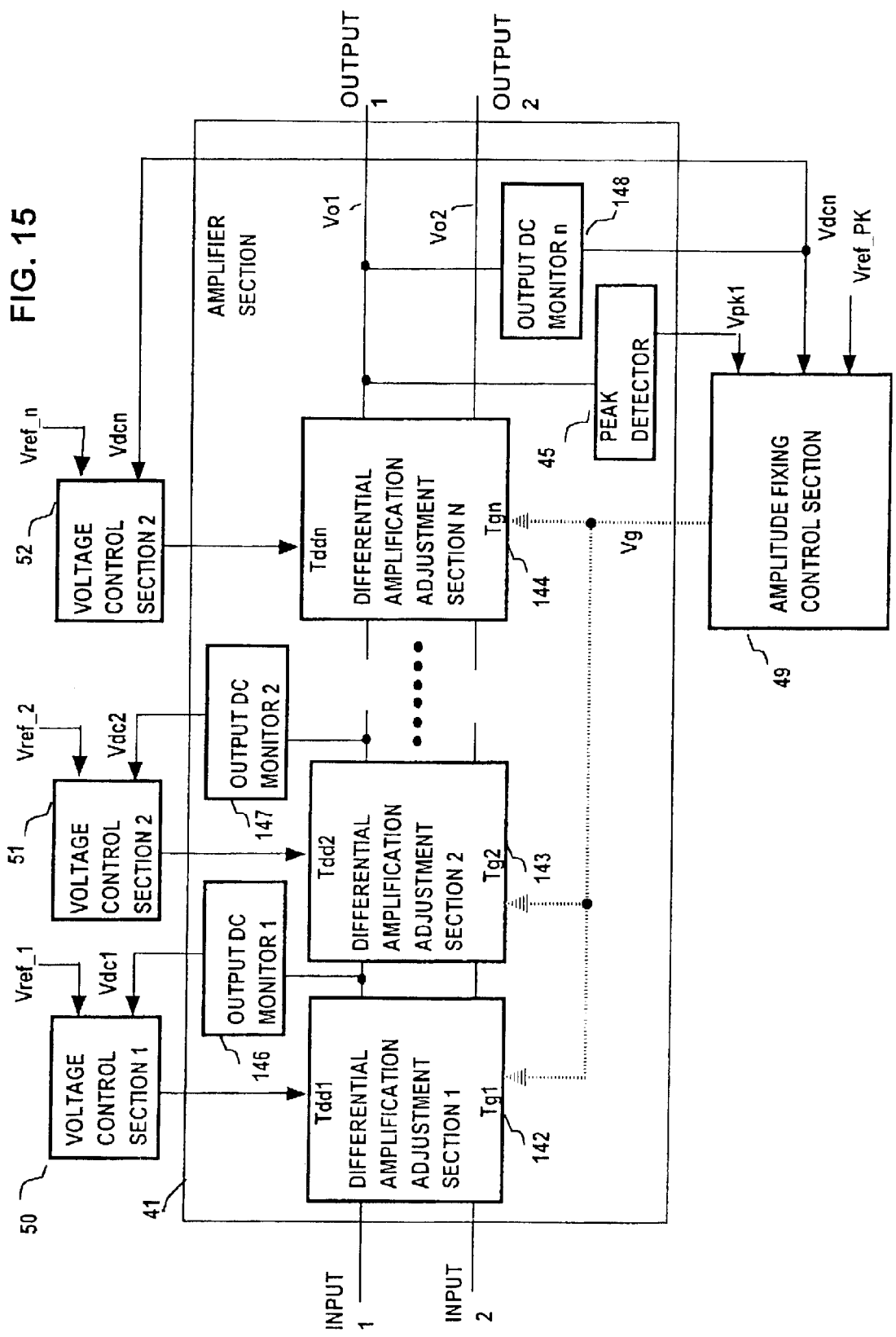
FIG. 15 is a general system block diagram of an alternative configuration of the third embodiment.

FIG. 15 is a general system block diagram of an alternative configuration of the third embodiment. In this case, the amplifier section 41 is based on n cascade-connected differential amplification adjustment circuit sections 142, 143, . . . , 144, where n is a plural integer. Each of these differential amplification adjustment circuit sections 142, 143, . . . , 144 can be configured as in any of the circuit examples of FIGS. 11A, 12, 13 or 14, and can incorporate a differential circuit as in any of FIGS. 2, 3 or 4 described above. The amplification adjustment circuit sections 142, 143, . . . , 144 are connected to respective ones of a set of n voltage control sections 50, 51, . . . 52, each of which can be configured as shown in any of the circuit examples of FIGS. 11, 12, 13 or 14 described above.

In addition, output signals produced from the n differential amplification adjustment circuit sections 142, 143, . . . , 144 are supplied to respectively corresponding ones of a set of n output DC monitor circuits 146, 147, . . . 148. That is to say, a specific one of a pair of complementary output signals produced from each of the n differential amplification adjustment circuit sections 142, 143, . . . , 144 (i.e., a signal corresponding to the output signal Vo1 described for a differential amplification adjustment circuit section in the preceding embodiments) is supplied to the corresponding one of the n output DC monitor circuits 146, 147, . . . 148.

As shown, the stage 144 of the n differential amplification adjustment circuit sections 142, 143, . . . , 144 is connected to the corresponding output DC monitor circuit 148, the corresponding voltage control section 52 and to the peak detector 45, in the same manner as for the differential amplitude adjustment circuit section 44 shown in FIG. 10, described hereinabove. The output DC monitor circuit 148 produces a detection signal designated as Vdcn, which is supplied to the amplitude fixing control section 49 together with an amplitude reference voltage Vref_PEAK (corresponding to the reference voltage Vref of the circuit of FIG. 10, etc.) and the peak detection signal Vpk1, with the amplitude fixing control section 49 thereby generating an amplitude control signal Vg in the same manner as described for the preceding embodiments.

With this configuration of the third embodiment, the amplitude control signal Vg is supplied to each of respective input control terminals Tg1, Tg2, . . . , Tgn of the n differential amplification adjustment circuit sections 142, 143, . . . , 144.

In addition, respective DC level detection signals Vdc1, Vdc2, . . . Vdcn produced from the n output DC monitor circuits 146, 147, . . . 148 are supplied to the n voltage control sections 50, 51, . . . , 52, together with n respective DC level reference voltages Vref_1, Vref_2, . . . , Vref_n.

Respective controlled supply voltages (if each differential amplification adjustment circuit section is configured as shown in FIG. 11A) or DC level control signals (if each differential amplification adjustment circuit section is configured as shown in any of FIGS. 12, 13 or 14) are supplied from the n voltage control sections 50, 51, . . . , 52 to respective input terminals Tdd1 Tdd2, . . . , Tddn of the n differential amplification adjustment circuit sections 142, 143, . . . , 144.

The operation of each of the n differential amplification adjustment circuit sections 142, 143, . . . , 144 in conjunction with the corresponding one of the n voltage control sections 50, 51, . . . , 52 and the corresponding one of the n output DC monitor circuits 146, 147, . . . 148 is identical to that described for the differential amplitude adjustment circuit section 44 in FIG. 10, described hereinabove. In addition, the operation of the differential amplification adjustment circuit section 144 in relation to the voltage control section 141, peak detector circuit 45 and amplitude fixing control section 49 for deriving the amplitude control signal Vg is identical to that described for the differential amplitude adjustment circuit section 44 of FIG. 10 in relation to the output DC monitor circuit 46, the peak detector circuit 45 and amplitude fixing control section 47 therein, so that further description will be omitted.

With this configuration of the third embodiment, the advantage is obtained that the dynamic range of input signal amplitude for which control can be applied by the AGC circuit is approximately n times that of the configuration of FIG. 10. In addition, the permissible range of variation of DC level of the input signals Input 1, Input 2 to the AGC circuit, or of variations in signal DC level which arise within the AGC circuit itself, within which precise control of the DC level of the output signal Vo1 is maintained, is substantially greater than is possible with the configuration of FIG. 10. These advantages are obtained together with the advantage of a simple circuit configuration, so that the supply voltage requirements of the AGC circuit are low.

In the same way as for the first and second embodiments, the third embodiment can be advantageously applied to an optical data receiving apparatus and an optical data transmission system such as shown in FIG. 6 and described above.

Fourth Embodiment

A fourth embodiment will be described, referring to the AGC circuit shown in block diagram form in FIG. 16, and to the specific circuit configurations and waveform diagrams of FIGS. 17A, 17B, and 12 to 14. It should be understood that the contents of these diagrams are intended only to illustrate the features and operation of the embodiment, and are not to be understood as limiting the embodiment. In the following, only features which differ from those of the preceding embodiments are described in detail.

Figure 16:
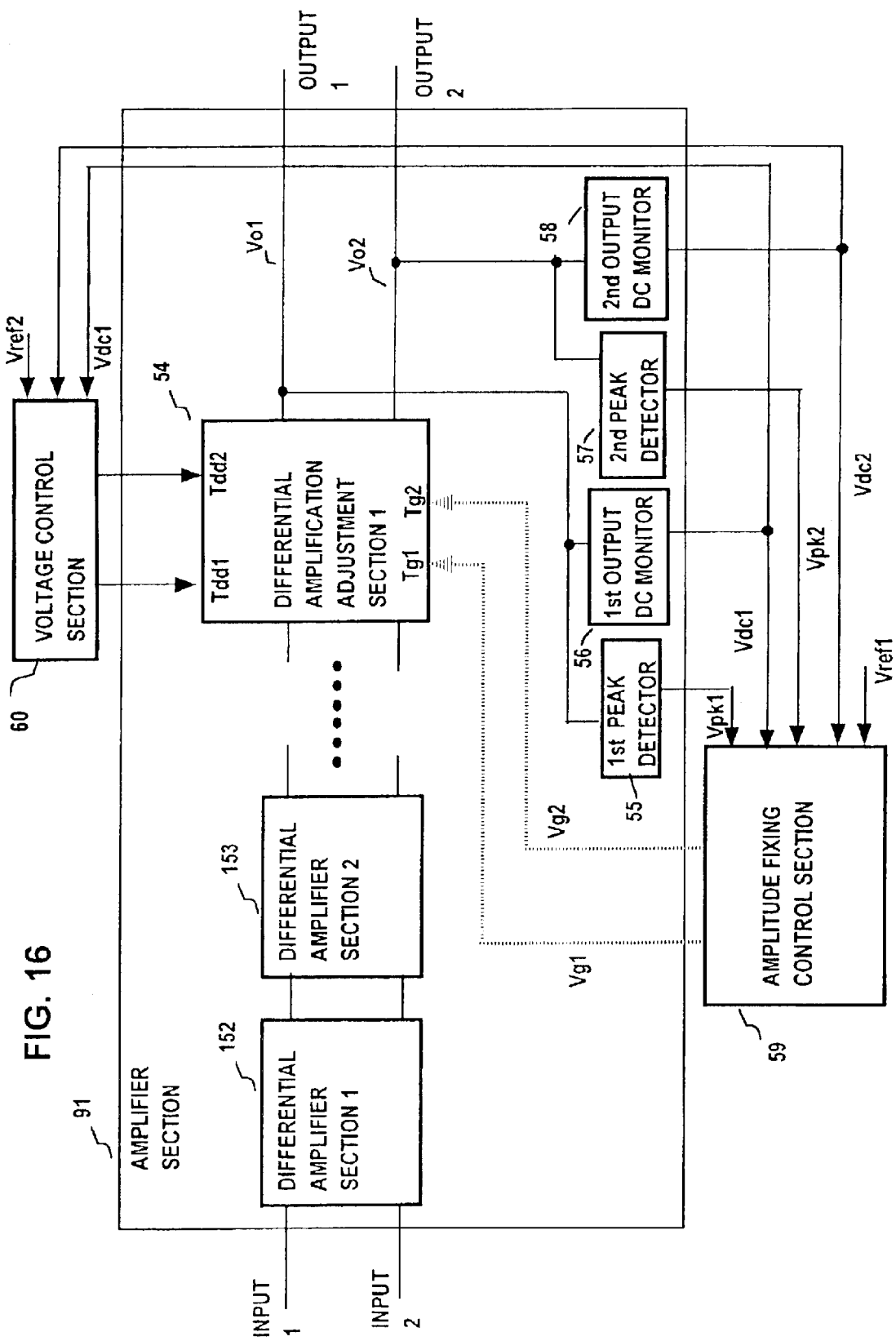
FIG. 16 is a general system block diagram of a fourth embodiment of an AGC circuit.

As shown in FIG. 16, this embodiment is formed of an amplifier section 91, an amplitude fixing control section 59, and a voltage control section 60. The amplifier section 91 is formed of a plurality of cascade-connected differential amplifier sections 152, 153, . . . , with the input signals Input 1, Input 2 being supplied to the first-stage differential amplifier section 152, and the output signals from a final stage of that series of differential amplifier sections being supplied to a differential amplitude adjustment circuit section 54. The amplifier section 51 further includes a 1st peak detector circuit 55 and 1st output DC monitor circuit 56, each coupled to receive the first complementary output signal Vo1 produced from the differential amplitude adjustment circuit section 54, and supply respective output signals Vpk1 and Vdc1 to the amplitude fixing control section 59, with the amplitude fixing control section 59 deriving a first amplitude control signal Vg1 based on the detection signals Vpk1 and Vdc1 and on a first reference voltage Vref1 which is supplied thereto, and with the amplitude control signal Vg being supplied to an input terminal Tg1 of the differential amplitude adjustment circuit section 54. The amplifier section 51 moreover includes a 2nd peak detector circuit 57 and 2nd output DC monitor circuit 58, each coupled to receive the second complementary output signal Vo2 from the differential amplitude adjustment circuit section 54, and to supply respective detection signals Vpk2 and Vdc2 to the amplitude fixing control section 59. The amplitude fixing control section 59 derives a second amplitude control signal Vg2 based on the detection signals Vpk2 and Vdc2 and on the aforementioned first reference voltage Vref1, and supplies the second amplitude control signal Vg2 to an input terminal Tg2 of the differential amplitude adjustment circuit section 54.

The amplitude control signals Vg1, Vg2 operate on the differential amplitude adjustment circuit section 54 to control the respective amplitudes of the first and second complementary output signals Vo1, Vo2 to an identical fixed value. That value is determined by the value of the first reference voltage Vref1, separately for each of the output signals Vo1, Vo2, in a similar manner to that described for the differential amplitude adjustment circuit section 24 of the embodiment of FIG. 1 for the case of controlling the amplitude of the output signal Vo1 alone.

The detection signal Vdc1 from the 1st output DC monitor circuit 56 is supplied to the voltage control section 60 together with a second reference voltage Vref2, and the voltage control section 60 derives the difference ΔVdc1 between these. The value of the reference voltage Vref2 is predetermined as the required value of DC component of each of the pair of complementary output signals Vo1, Vo2. A first controlled supply voltage is thereby produced from the voltage control section 60, as described hereinabove for the voltage control section 141 of the third embodiment, and applied to a first control input terminal Tdd1 of the differential amplitude adjustment circuit section 54, for acting such as to reduce the magnitude of the difference ΔVdc1. In addition, the detection signal Vdc2 which is produced from the 2nd output DC monitor circuit 58 is supplied to the voltage control section 60, and the voltage control section 60 derives the difference ΔVdc2 between the value of that detection signal and the second reference voltage Vref2. A second controlled supply voltage is thereby produced from the voltage control section 60, and applied to a second control input terminal Tdd2 of the differential amplitude adjustment circuit section 54, for acting such as to reduce the magnitude of the difference ΔVdc2.

The voltage control section 60 is provided with an internal circuit whereby respective initial values of the aforementioned first and second controlled supply voltages are established when power begins to be supplied to the AGC circuit, with these initial values continuing until the detection signals Vdc1, Vdc2 begin to be supplied from the output DC monitor circuits 56, 58 respectively. Thereafter, the respective values of the first and second controlled supply voltages are determined based on the aforementioned differences ΔVdc1, ΔVdc2.

As can be understood from the above, the essential differences between this fourth embodiment and the third embodiment shown in FIG. 10 are that:

(a) With the fourth embodiment, the respective DC component levels both of the complementary output signals Vo1, Vo2 are detected, and are respectively separately held at an identical fixed value, by feedback control based on the detection signals Vdc1 and Vdc2 respectively, and (b) as a result, the accuracy of DC level of the second output signal Vo2 is determined by feedback control, rather than by the accuracy of matching of resistor values and FET characteristics as described hereinabove for the third embodiment.

Figure 17A:
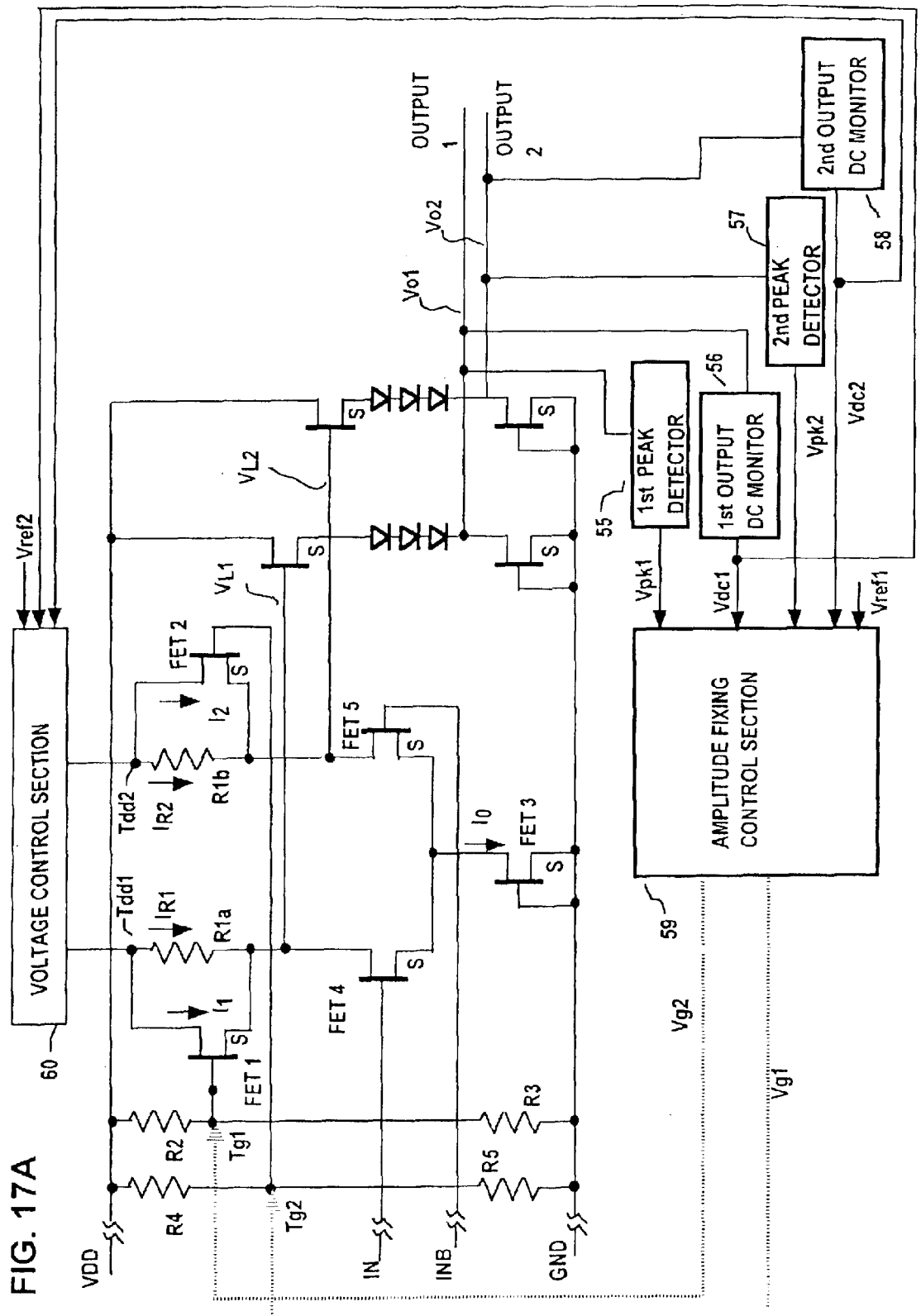
FIG. 17A is a circuit diagram showing the internal configuration of a differential amplification adjustment circuit section in the fourth embodiment, and showing connections to peripheral circuit sections.

FIG. 17A shows a specific example of a circuit configuration for the differential amplitude adjustment circuit section 54 of this embodiment, and the connection relationships of that circuit to the peak detector circuit 45, the 1st output DC monitor circuit 56, the 2nd peak detector circuit 57, the 2nd output DC monitor circuit 58, the amplitude fixing control section 59 and the voltage control section 60.

This circuit differs from that of FIG. 11A described hereinabove in that:

(a) whereas with the circuit of FIG. 11a a single controlled supply voltage produced from the voltage control section 141 is applied to a single input terminal Tdd and hence to each of the drain electrodes of FETs 1 and 2 and to each of the load resistors R1a, R1b of the differential circuit, with the circuit of FIG. 17A the aforementioned first controlled supply voltage produced from the voltage control section 60 is applied to the first input terminal Tdd1 and hence to the drain electrode of FET 1 and to the load resistor R1a of the differential circuit, while the aforementioned second controlled supply voltage produced from the voltage control section 60 is applied to the second input terminal Tdd2 and hence to the drain electrode of FET 2 and to the load resistor R1b of the differential circuit, and (b) whereas with the circuit of FIG. 11a a single amplitude control signal Vg is applied in common to the gate electrodes of both of the FETs 1 and 2 which perform the signal amplitude control function, with the circuit of FIG. 17A the first and second amplitude control signals Vg1, Vg2 are applied separately to the gate electrodes of the FETs 1 and 2 respectively, to thereby effect respectively independent control of the amplitudes of the output signals Vo1, Vo2, as described for the second embodiment shown in FIG. 7.

The relationship between the currents I1, IR1, I2, IR2 and I0 shown in the circuit of FIG. 17A are as follows:

$$I0 = IR1 + I1 + IR2 + I2 \quad (19)$$

Designating the value of each of the load resistors R1a, R1b of the differential circuit as r1, the relationship between the voltage levels VL1, VL2 and r1, IR2, IR2 can be expressed as:

$$VL1 = 2 \times r1 \times IR1 \quad (20)$$

$$VL2 = 2 \times r1 \times IR2 \quad (21)$$

Designating the first and second controlled supply voltages as VDDs1 and VDDs2 respectively, the following relationships exist:

$$VDDs1 = VDD \pm \Delta Vdc1 \quad (22)$$

$$VDDs2 = VDD \pm \Delta Vdc2 \quad (23)$$

It can thus be understood that with the fourth embodiment, adjustment of the first controlled supply voltage will effect adjustment of the DC level which appears at the drain electrode of FET 4 of the differential circuit, and so will effect adjustment of the DC level of the corresponding output signal Vo1 in a direction such as to reduce the aforementioned difference ΔVdc1 towards zero. Similarly, adjustment of the second controlled supply voltage will effect adjustment of the DC level which appears at the drain electrode of FET 5 of the differential circuit, and so will effect adjustment of the DC level of the corresponding output signal Vo2 in a direction such as to reduce the aforementioned difference ΔVdc2 towards zero, independently of any adjustment which is applied to the output signal Vo1. Hence, the DC levels of each of the output signals Vo1, Vo2 are respectively separately controlled to be each held fixed at the level of the second reference voltage Vref2, as illustrated by the waveform diagram of FIG. 17B.

Figure 18:
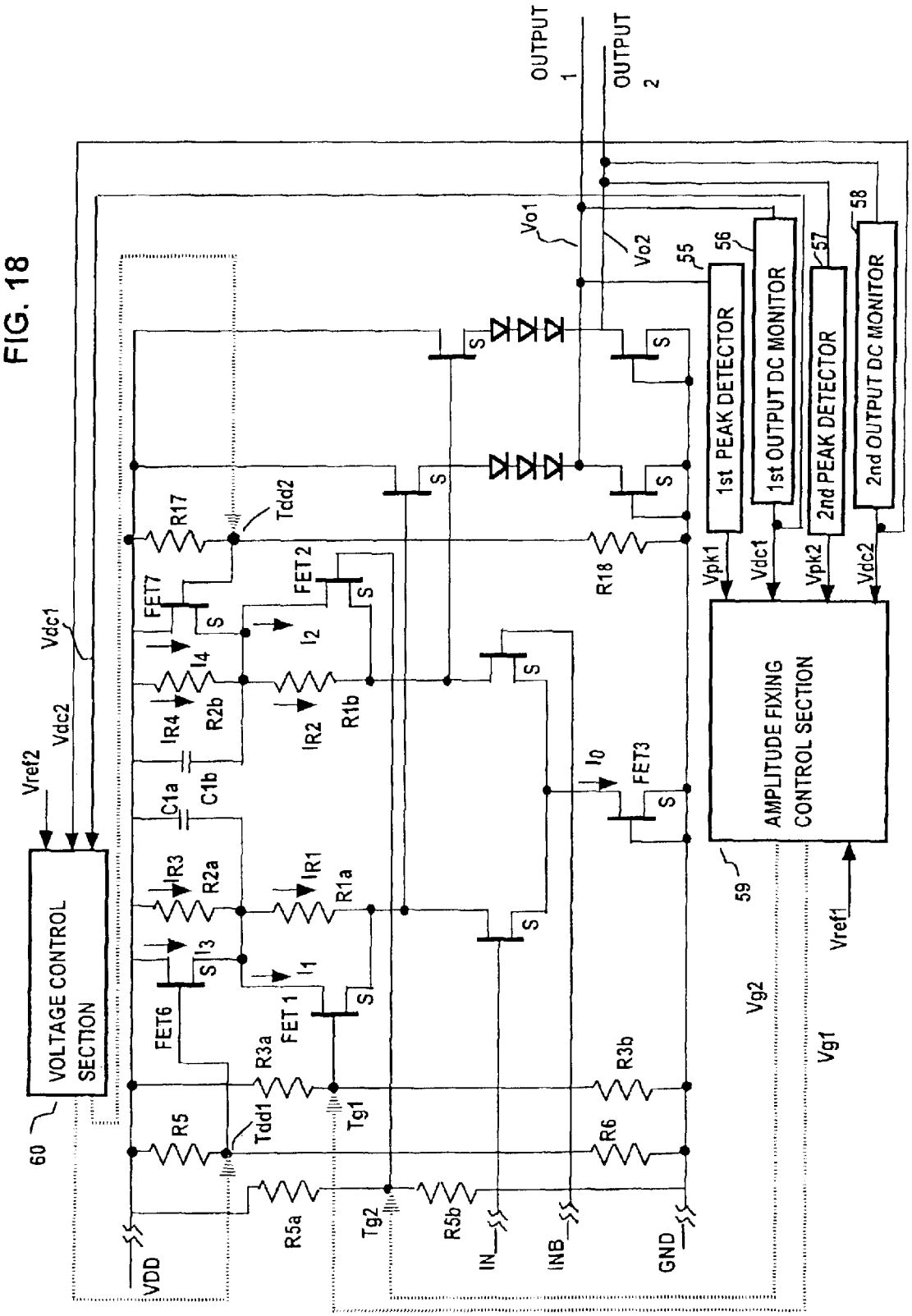
FIG. 18 is a circuit diagram showing a second example of the internal configuration of a differential amplification adjustment circuit section in the fourth embodiment, and showing connections to peripheral circuit sections.

FIG. 18 shows another example of a circuit configuration for the differential amplitude adjustment circuit section 54 of the fourth embodiment, and the connection relationships of that circuit to the peak detector circuit 45, the 1st output DC monitor circuit 56, the 2nd peak detector circuit 57, the 2nd output DC monitor circuit 58, the amplitude fixing control section 59 and the voltage control section 60. This circuit differs from that of FIG. 17A in that, instead of the pair of controlled supply voltages being supplied directly from the voltage control section 60 to the differential amplitude adjustment circuit section 54, the supply voltage VDD is supplied to the drain electrodes of FETs 6, 7 and to the resistors R2a, R2b which are respectively connected in parallel with these FETs, while a first DC level control signal is supplied from the voltage control section 60 via the input terminal Tdd1 to the gate electrode of the FET 6, and a second DC level control 2C signal is supplied from the voltage control section 60 via the input terminal Tdd2 to the gate electrode of the FET 7.

Respective AC by-pass capacitors C1a and C1b are connected in parallel with the resistors R2a, R2b.

It can be understood that the operation of this circuit is essentially similar to that of FIG. 12 of the third embodiment described hereinabove, and differs only in that:

(a) With the circuit of FIG. 12, no AC signal is developed at the junction between the resistor R10 and the load resistors R1a, R1b of the differential circuit, so that no AC by-pass capacitor is necessary. However with the circuit of FIG. 18, such AC by-passing may be necessary.

(b) With the circuit of FIG. 12, the supply voltage for the FETs 1, 2 and resistors R1a, R1b is provided from the parallel combination of FET 6, R10 and so is controlled by the DC level control signal applied to the gate electrode of FET 6. However with the circuit of the fourth embodiment shown in FIG. 18, the supply voltage for the FET 1 and resistor R1a is provided from the parallel combination of FET 6, R2a and so is controlled by the first DC level control signal (derived based on the DC level of output signal Vo1) which is applied to the gate electrode of FET 6, while the supply voltage for the FET 2 and resistor R1b is provided from the parallel combination of FET 7, R2b and so is controlled by the second DC level control signal (derived based on the DC level of output signal Vo2) which is applied to the gate electrode of FET 7.

An initial value of DC level control signal is applied to the gate electrodes of FET 6 when power is applied to the circuit, by the resistive voltage divider formed of resistors R5 and R6, and similarly an initial value of DC level control signal is applied to the gate electrode of FET 7 by the resistive voltage divider formed of resistors R17, R18.

The relationship between the current I0 which is passed by the current source FET 3 of the differential FET pair 4, 5 and the currents I1, I2, I3, I4, IR1, IR2, IR3, IR4 in the circuit of FIG. 18 can be expressed as:

$$I0=IR1+IR2+I1+I2=IR3+IR4+I3+I4 \quad (24)$$

Designating V1 as the controlled value of supply voltage which is applied to the FET 1 and resistor R1a, and V2 as the controlled value of supply voltage which is applied to the FET 2 and resistor R1b, and the value of each of R1a, R1b as r2, V1 and V2 can be expressed as:

$$V1=VDD-IR3 \times r2 \quad (25)$$

$$V2=VDD-IR4 \times r2 \quad (26)$$

It can thus be understood that this circuit provides the same effects as those of the circuit of FIG. 17A described above.

Figure 19:
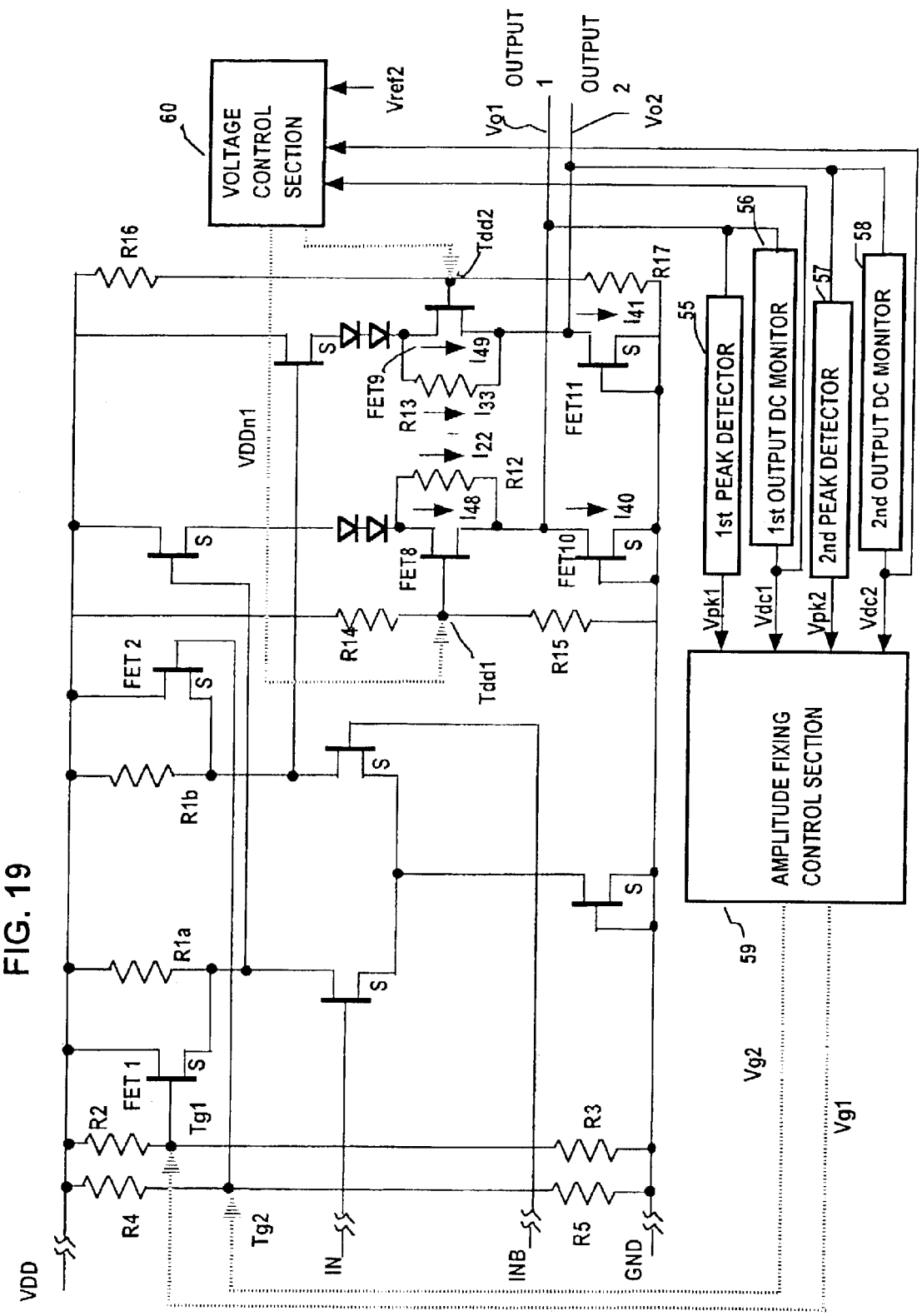
FIG. 19 is a circuit diagram showing a third example of the internal configuration of a differential amplification adjustment circuit section in the fourth embodiment, and showing connections to peripheral circuit sections.

FIG. 19 shows another example of a circuit configuration for the differential amplitude adjustment circuit section 54 of the fourth embodiment, and the connection relationships of that circuit to the peak detector circuit 45, the 1st output DC monitor circuit 56, the 2nd peak detector circuit 57, the 2nd output DC monitor circuit 58, the amplitude fixing control section 59 and the voltage control section 60. This circuit differs from that of FIG. 17A in that, instead of a pair of controlled supply voltages being supplied directly from the voltage control section 60 to the differential amplitude adjustment circuit section 54, control of the respective DC levels of the output signals Vo1, Vo2 is executed within the emitter-follower output stages of the differential amplitude adjustment circuit section 54, in a similar manner to that described hereinabove for the circuit example of FIG. 14 of the third embodiment (for the case of DC level control of a single one of the output signals Vo1, Vo2).

The following relationship exists between the currents I48, I49 which flow in the FETs 8, 9 respectively, the currents I22, I33 which flow in the resistors R12, R13 respectively, and the currents I40, I41 which flow in the current source FETs 10, 11 respectively:

$$I40=I48+I22=I49+I33=I41 \quad (27)$$

Specifically, with the circuit of FIG. 19, a first DC level control signal, derived based on the difference between the detection signal Vdc1 and the second reference voltage Vref2 is applied from the voltage control section 60 to a first control input terminal Tdd1, and hence to the gate electrode of the FET 8, which controls a level of current flow through the resistor R12 and hence controls the DC level of the output signal Vo1. Similarly, a second DC level control signal, derived based on the difference between the detection signal Vdc2 and the second reference voltage Vref2, is applied from the voltage control section 60 to a second control input terminal Tdd1, and hence to the gate electrode of the FET 9, which controls a level of current flow through the resistor R13 and hence controls the DC level of the output signal Vo2.

In that way, the DC levels of the complementary pair of output signals Vo1, Vo2 of the differential amplitude adjustment circuit section 54 are respectively independently controlled, to be each fixed at the value of the second reference voltage Vref2.

In the above descriptions of the circuits of FIGS. 17 to 19 of the fourth embodiment, it is assumed that the differential circuit of the differential amplitude adjustment circuit section 54 is configured as shown in FIG. 2. However it would be equally possible to configure that differential circuit as shown in FIG. 3, with similar effects to those described above being obtainable.

Figure 20:
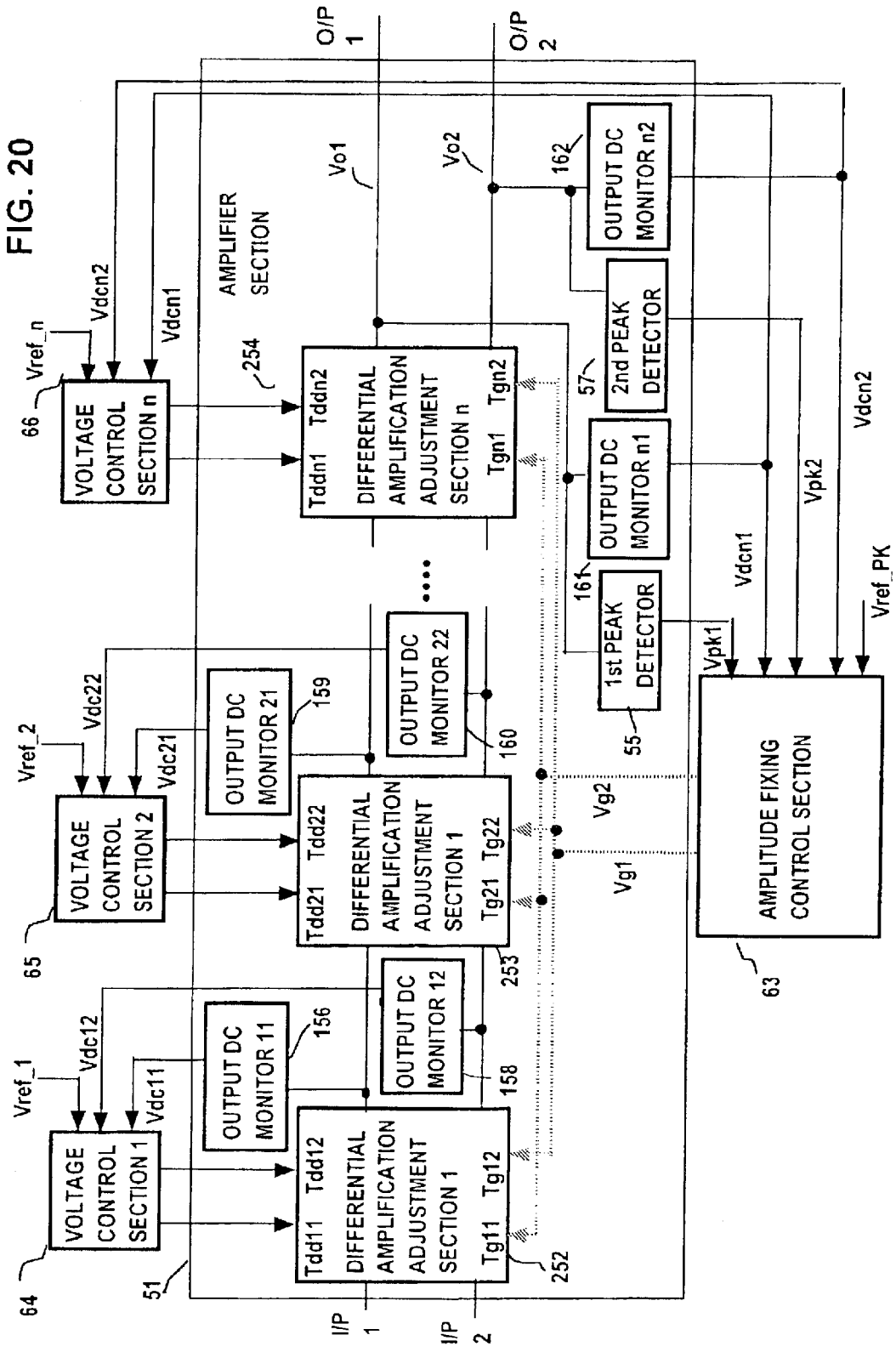
FIG. 20 is a general system block diagram of an alternative configuration of the fourth embodiment.
Figure 21:
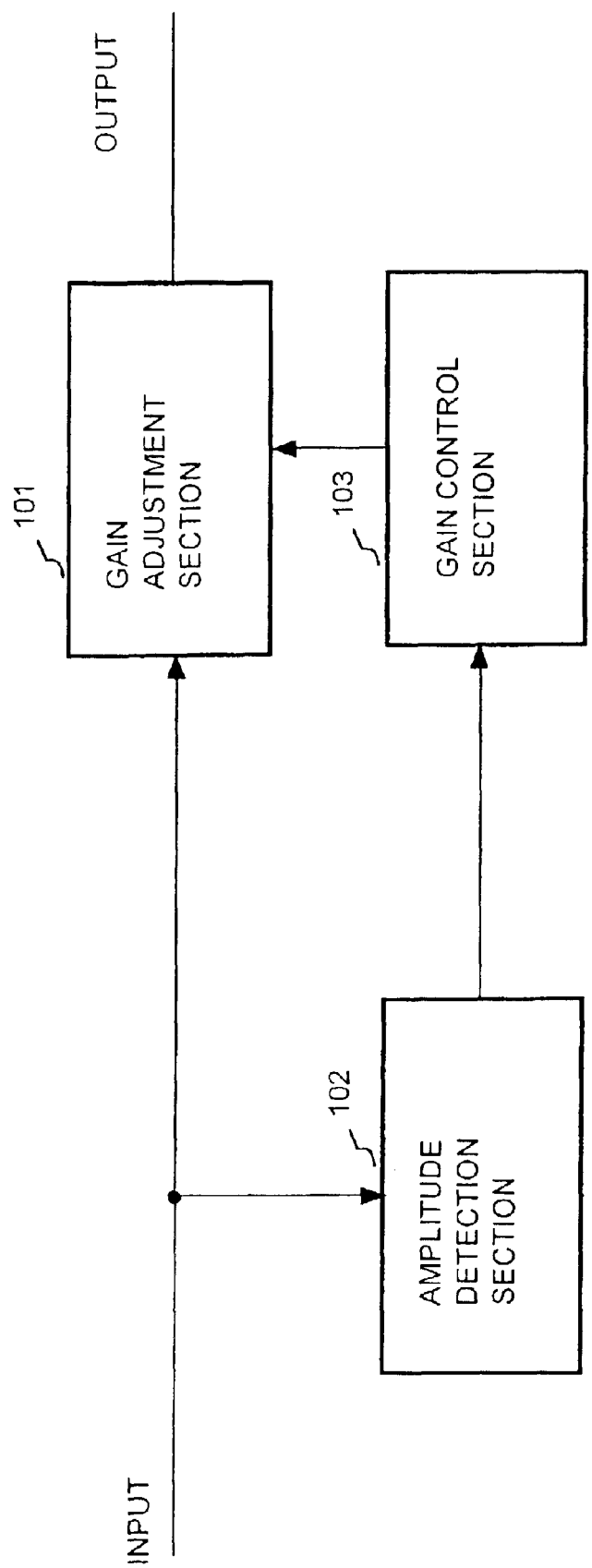
FIG. 21 is a general system block diagram of a prior art example of an AGC circuit.

An alternative configuration of the fourth embodiment of an AGC circuit is shown in the system block diagram of FIG. 20. In this case, the differential amplitude adjustment circuit section 54 contains n cascade-connected differential amplification adjustment circuit sections 252, 253, . . . , 254, where n is a plural integer. Each of these differential amplification adjustment circuit sections 252, 253, . . . , 254 can be configured as in any of the circuit examples of FIGS. 17, 18, or 19 described above. The amplification adjustment circuit sections 252, 253, . . . , 254 are connected to respective ones of a set of n voltage control sections 64, 65, . . . , 66 each of which operates as described for the circuit examples of FIGS. 17A, 18 or 19 described above.

In addition, a first one of a pair of complementary output signal produced from each of the n differential amplification adjustment circuit sections 252, 253, 254 is supplied to a corresponding one of a first set of n output DC monitor circuits 156, 159, . . . 161, while a second one of the pair of complementary output signal produced from each of the n differential amplification adjustment circuit sections 252, 253, . . . , 254 is supplied to a corresponding one of a second set of n output DC monitor circuits 158, 160, . . . 162.

In addition, the first one of the pair of complementary output signals produced from the final-stage differential amplification adjustment circuit section 254, i.e., Vo1, is also supplied to the first peak detector circuit 55, while the second one of the pair of complementary output signals produced from the final-stage differential amplification adjustment circuit sections 254, i.e., Vo2, is also supplied to the second peak detector circuit 57.

Respective second reference voltages Vref_1, Vref_2, . . . Vref_n are supplied to the voltage control sections 64, 65, . . . 66.

First and second amplitude control signals Vg1 and Vg2 are derived by the amplitude fixing control section 63 in the same manner as described for the configuration of FIG. 16.

The amplitude control signal Vg1 is supplied to respective input terminals Tg12, Tg22, . . . , Tgn2 of the n differential amplification adjustment circuit sections 252, 253, . . . , 254, while the amplitude control signal Vg2 is supplied to respective input terminals Tg11, Tg21, . . . , Tgn1 of these differential amplification adjustment circuit sections.

With respect to controlling the DC levels of the pair of complementary output signals produced therefrom, each of the n differential amplification adjustment circuit sections 252, 253, . . . , 254 operates in an identical manner to that of the differential amplitude adjustment circuit section 54 of the configuration shown in FIG. 16 for the fourth embodiment, described hereinabove, so that detailed description will be omitted.

In addition, with respect to deriving the first and second amplitude control signals Vg1, Vg2 based on the output signals Vo1, Vo2 of the AGC circuit, the differential amplification adjustment circuit section 254, the first and second peak detector circuits 55 and 57 and the amplitude fixing control section 63 operate in combination as described for the differential amplitude adjustment circuit section 54, the first and second peak detector circuits 55 and 57 and the amplitude fixing control section 59 of the configuration of FIG. 16, described hereinabove, so that detailed description will be omitted.

With this configuration of the fourth embodiment, the advantage is obtained that the dynamic range of input signal amplitude for which control can be applied by the AGC circuit to maintain each of the output signals Vo1, Vo2 at a constant amplitude is approximately n times that of the configuration of FIG. 16. In addition, the permissible range of variation of DC level of the input signals Input 1, Input 2 to the AGC circuit, or of variations in signal DC level which arise within the AGC circuit itself, for which the AGC circuit can maintain the respective DC levels of the output signals Vo1, Vo2 at a constant value is substantially greater than is possible with the configuration of FIG. 16. Furthermore, a higher precision of maintaining these DC levels of the output signals Vo1, Vo2 can be achieved, with the configuration of FIG. 20, than is possible with the configuration of FIG. 16.

These advantages are obtained together with the advantage of a simple circuit configuration, so that the supply voltage requirements of the AGC circuit are low.

In the same way as for the first to third embodiments, the fourth embodiment can be advantageously applied to an optical data receiving apparatus and an optical data transmission system such as shown in FIG. 6 and described above.

What is claimed is:

1. An AGC (automatic gain control) circuit comprising
   gain-controlled amplifier means including at least one differential amplification adjustment circuit section, for performing differential amplification of first and second input signals to produce complementary first and second controlled output signals while controlling respective amplitudes of said first and second controlled output signals,
   peak detection means for detecting a peak value of at least one of said first and second controlled output signals,
   DC monitoring means for measuring a value of a DC component of at least one of said first and second controlled output signals, and
   amplitude fixing control means for deriving a value of voltage difference between said peak value and said DC component, and for generating an amplitude control signal based on comparing said voltage difference with an externally supplied reference voltage;
   wherein said differential amplification adjustment circuit section is adapted to apply a degree of amplification that is determined by said amplitude control signal.

2. An AGC circuit as claimed in claim 1, wherein
   said peak detection means comprises a peak detector circuit for deriving a peak value of amplitude of said first controlled output signal,
   said DC monitoring means comprises a DC component monitoring circuit for deriving a value of a DC component of said first controlled output signal, and
   said amplitude fixing control means comprises an amplitude fixing control circuit for deriving a difference between said peak amplitude value and said DC component value, and for comparing said difference with said amplitude control reference voltage, to obtain said amplitude control signal based on a result of said comparison.

3. An AGC circuit as claimed in claim 2, wherein said differential amplification adjustment circuit section comprises a pair of FETs (field effect transistors) connected as a differential pair and having respective load resistors connected thereto, and a pair of current source FETs connected in parallel with respective ones of said load resistors and having respective gate electrodes thereof coupled to receive said amplitude control signal, for adjusting respective values of current flow in said load resistors in accordance with said amplitude control signal to thereby control respective amplitudes of said first and second controlled output signals.

4. An AGC circuit as claimed in claim 3, wherein said differential amplification adjustment circuit section further comprises a pair of resistors respectively connected in series with said pair of current source FETs, with each series-connected combination of a resistor and current source FET being connected in parallel with a corresponding one of said load resistors.

5. An AGC circuit as claimed in claim 2, wherein said differential amplification adjustment circuit section comprises a single current source FET connected to respective source electrode of said differential pair of FETs and having said amplitude control signal coupled to a gate electrode of said single current source FET, for adjusting respective values of current flow in said load resistors in accordance with said amplitude control signal to thereby control respective amplitudes of said first and second controlled output signals.

6. An AGC circuit as claimed in claim 2, wherein said gain-controlled amplifier means comprises
   a plurality of differential amplifier circuit sections connected in cascade, for amplifying said first and second input signals to produce complementary first and second output signals from a final stage of said differential amplifier circuit sections, and
   a differential amplification adjustment circuit section coupled to receive said complementary first and second output signals, controlled by said amplitude control signal for adjusting respective amplitudes of said first and second output signals from said final stage of the differential amplifier circuit sections to produce said first and second controlled output signals.

7. An AGC circuit as claimed in claim 2, wherein said gain-controlled amplifier means comprises a plurality of differential amplification adjustment circuit sections connected in cascade, for amplifying said first and second input signals to produce said complementary first and second controlled output signals from a final stage thereof, each of said differential amplification adjustment circuit sections controlled by said amplitude control signal.

8. An AGC circuit as claimed in claim 1, wherein said peak detection means comprises a first peak detector circuit for deriving a peak value of amplitude of said first controlled output signal and a second peak detector circuit for deriving a peak value of amplitude of said second controlled output signal, said DC monitoring means comprises a first DC component monitoring circuit for deriving a value of a DC component of said first controlled output signal and a second DC component monitoring circuit for deriving a value of a DC component of said second controlled output signal, and said amplitude fixing control means comprises an amplitude fixing control circuit for deriving a difference between said DC component of the first controlled output signal and said peak amplitude value of said first controlled output signal, and comparing said difference with said amplitude control reference voltage, to obtain a first amplitude control signal based on a result of said comparison, and for deriving a difference between said DC component of the second controlled output signal and said peak amplitude value of said second controlled output signal, and comparing said difference with said amplitude control reference voltage, to obtain a second amplitude control signal based on a result of said comparison.

9. An AGC circuit as claimed in claim 8, wherein said differential amplification adjustment circuit section comprises a pair of FETs (field effect transistors) connected as a differential pair, and respective load resistors of said pair of FETs, and first current control means responsive to said first amplitude control signal for modifying a level of current flow through a first one of said load resistors and second current control means responsive to said second amplitude control signal for modifying a level of current flow through a second one of said load resistors.

10. An AGC circuit as claimed in claim 9, wherein said first current control means comprises a first current source FET having drain and source electrodes thereof connected in parallel with said first one of said load resistors and a gate electrode coupled to receive said first amplitude control signal and said second current control means comprises a second current source FET having drain and source electrodes thereof connected in parallel with said second one of said load resistors and a gate electrode coupled to receive said second amplitude control signal.

11. An AGC circuit as claimed in claim 8, wherein said gain-controlled amplifier means comprises a plurality of said differential amplifier circuit sections connected in cascade, for amplifying said first and second input signals to produce complementary first and second output signals from a final stage of said differential amplifier circuit sections, and said differential amplification adjustment circuit section, coupled to receive said complementary first and second output signals from said final stage, controlled by said first amplitude control signal for adjusting an amplitude of said first output signals from said final stage of the differential amplifier circuit sections to produce said first controlled output signal and controlled by said second amplitude control signal for adjusting an amplitude of said second output signals from said final stage of the differential amplifier circuit sections to produce said second controlled output signal.

12. An AGC circuit as claimed in claim 8 wherein said gain-controlled amplifier means comprises a plurality of said differential amplification adjustment circuit sections, connected in cascade, for amplifying said first and second input signals to produce said complementary first and second controlled output signals from a final stage thereof, each of said differential amplification adjustment circuit sections controlled by said first and second amplitude control signals.

13. An AGC circuit as claimed in claim 1, wherein said peak detection means comprises a peak detector circuit for deriving a peak value of amplitude of said first controlled output signal, said DC monitoring means comprises a DC component monitoring circuit for deriving a value of a DC component of said first controlled output signal, and said amplitude fixing control means comprises an amplitude fixing control circuit for deriving a difference between said peak amplitude value and said DC component value, and for comparing said difference with said amplitude control reference voltage, to obtain said amplitude control signal based on a result of said comparison;

further comprising voltage control circuit means coupled between said DC monitoring means and said differential amplification adjustment circuit section, for comparing said measured value of DC component with an externally supplied DC component reference voltage and generating a DC component control voltage in accordance with a result of said comparison, wherein said differential amplification adjustment circuit section is adapted to adjust said DC component in accordance with said DC component control voltage.

14. An AGC circuit as claimed in claim 13, wherein said differential amplification adjustment circuit section comprises a pair of FETs (field effect transistors) connected as a differential pair and having respective load resistors connected thereto, and a pair of current source FETs connected in parallel with respective ones of said load resistors and having respective gate electrodes thereof coupled to receive said amplitude control signal, for adjusting respective values of current flow in said load resistors in accordance with said amplitude control signal to thereby control respective amplitudes of said first and second controlled output signals, and said DC component control voltage constitutes a variable power supply voltage which is supplied to a common connection of said load resistors and said pair of current source FETs.

15. An AGC circuit as claimed in claim 13, wherein said differential amplification adjustment circuit section comprises a pair of FETs (field effect transistors) connected as a differential pair and having respective load resistors connected thereto, and a pair of current source FETs connected in parallel with respective ones of said load resistors and having respective gate electrodes thereof coupled to receive said amplitude control signal, for adjusting respective values of current flow in said load resistors in accordance with said amplitude control signal to thereby control respective amplitudes of said first and second controlled output signals, and a parallel combination of a single current source FET and a resistor, connected between a fixed power supply voltage and a common connection of said load resistors and said pair of current source FETs, and wherein said DC component control voltage constitutes a control signal which is applied to a gate electrode of said single current source FET.

16. An AGC circuit as claimed in claim 13, wherein
said differential amplification adjustment circuit section comprises
first and second amplifier FETs connected as a differential pair and having respective first and second load resistors, a first current source FET connected in parallel with said first load resistor and a second current source FET connected in parallel with said second load resistor, with respective gate electrodes of said first and second current source FETs coupled to receive said amplitude control signal,
a third current source FET, a first voltage control resistor and a first capacitor which are connected in parallel between a fixed power supply voltage and a common connection of said first amplifier FET and first load resistor, and a fourth current source FET, a second voltage control resistor and a second capacitor which are connected in parallel between said fixed power supply voltage and a common connection of said second amplifier FET and second load resistor,
wherein said DC component control voltage constitutes a control signal which is applied to respective gate electrodes of said third and fourth current source FETs.

17. An AGC circuit as claimed in claim 13, wherein said differential amplification adjustment circuit section comprises first and second source follower circuits for outputting respective ones of complementary first and second output signals, and wherein each of said source follower circuits comprises
a source follower FET having a drain electrode connected to a first fixed power supply voltage, and a first current source FET having a source electrode connected to a second fixed power supply voltage, and
a parallel combination of a second current source FET and a voltage control resistor, connected between a source electrode of said source follower FET and a drain electrode of said first current source FET;
wherein said DC component control voltage constitutes a control signal which is applied to a gate electrode of said second current source FET.

18. An AGC circuit as claimed in claim 13, wherein said gain-controlled amplifier means comprises
a plurality of differential amplifier circuit sections connected in cascade, for amplifying said first and second input signals to produce complementary first and second output signals from a final stage of said differential amplifier circuit sections, and
a differential amplification adjustment circuit section coupled to receive said complementary first and second output signals, controlled by said amplitude control signal for adjusting respective amplitudes of said first and second output signals from said final stage of the differential amplifier circuit sections to produce said first and second controlled output signals;
and wherein
said peak detection means comprises a peak detector circuit coupled to detect a peak value of amplitude of said first controlled output signal and produce an output voltage indicative of said peak value,
said DC monitoring means comprises an DC component monitoring circuit coupled to detect a value of a DC component of said first controlled output signal and produce an output voltage indicative of said DC component value,
said amplitude fixing control means comprises an amplitude fixing control circuit for comparing a difference between said output voltages from said peak detector circuit and said DC component monitoring circuit with said amplitude control reference voltage, to derive said amplitude control signal based on a result of said comparison, and
said DC component control voltage is supplied to said differential amplification adjustment circuit section for controlling said DC component of said first and second controlled output signals.

19. An AGC circuit as claimed in claim 13, wherein said gain-controlled amplifier means comprises a plurality of differential amplification adjustment circuit sections connected in cascade, for amplifying said first and second input signals to produce said complementary first and second controlled output signals from a final stage thereof, each of said differential amplification adjustment circuit sections controlled by said amplitude control signal,
and wherein
said peak detection means comprises a peak detector circuit coupled to detect a peak value of amplitude of said first controlled output signal and produce an output voltage indicative of said peak value,
said DC monitoring means comprises a plurality of DC component monitoring circuits respectively corresponding to said differential amplification adjustment circuit sections, each said DC component monitoring circuit coupled to detect a value of a DC component of a first one of a complementary pair of first and second output signals produced from the corresponding one of said differential amplification adjustment circuit sections, for producing an output voltage indicative of a DC component value of said output signal,
said amplitude fixing control means comprises an amplitude fixing control circuit for deriving a difference between an output voltage from said peak detector circuit and an output voltage from said DC component monitoring circuit of a final stage of said plurality of differential amplification adjustment circuit sections, and comparing said difference with said amplitude control reference voltage, to derive said amplitude control signal based on a result of said comparison, and
said voltage control circuit means comprises a plurality of voltage control circuit sections respectively corresponding to said differential amplification adjustment circuit sections and each coupled to receive one of a plurality of respectively separately determined reference voltages, for comparing the output voltage from the corresponding one of the DC component monitoring circuits with the corresponding one of said reference voltages to thereby derive a corresponding DC component control voltage, and supplying said corresponding DC component control voltage to the corresponding one of said differential amplification adjustment circuit sections.

20. An AGC circuit as claimed in claim 1, wherein
said peak detection means comprises a first peak detector circuit for deriving a peak value of amplitude of said first controlled output signal and a second peak detector circuit for deriving a peak value of amplitude of said second controlled output signal,
said DC monitoring means comprises a first DC component monitoring circuit for deriving a value of a DC component of said first controlled output signal and producing a first monitor voltage indicative of said DC component value and a second DC component monitoring circuit coupled to detect a value of a DC component of said second controlled output signal and producing a second monitor voltage indicative of said DC component value, said amplitude fixing control means comprises an amplitude fixing control circuit for deriving a difference between said peak amplitude value of said first controlled output signal and said first monitor voltage, and comparing said difference with said amplitude control reference voltage, to derive a first amplitude control signal based on a result of said comparison, and for deriving a difference between said peak amplitude value of said second controlled output signal and said first second voltage, and comparing said difference with said amplitude control reference voltage, to derive a second amplitude control signal based on a result of said comparison, and said voltage control circuit means comprises a voltage control circuit coupled to receive said first and second monitor voltages and said DC component reference voltage, for comparing said first monitor voltage with said DC component reference voltage to derive a first DC component control voltage and for comparing said second monitor voltage with said DC component reference voltage to derive a second DC component control voltage;

wherein said differential amplification adjustment circuit section is adapted to adjust said DC components of said first and second controlled output signals in accordance with said first and second DC component control voltages respectively, and to adjust said amplitudes of said first and second controlled output signals in accordance with said first and second amplitude control signals respectively.

21. An AGC circuit as claimed in claim 20, wherein said differential amplification adjustment circuit section comprises a pair of FETs connected as a differential pair and having respective load resistors connected thereto, and first and second current source FETs connected in parallel with respective ones of said load resistors and having respective gate electrodes thereof coupled to receive said first and second amplitude control signals respectively, for adjusting respective values of current flow in said load resistors in accordance with said amplitude control signal to thereby control said amplitudes of said first and second controlled output signals respectively, and wherein said first and second DC component control voltages constitute respective adjustable power supply voltages which are respectively supplied to a common connection of said first current source FET and a first one of said load resistors and to a to a common connection of said second current source FET and a second one of said load resistors.

22. An AGC circuit as claimed in claim 20, wherein said differential amplification adjustment circuit section comprises first and second amplifier FETs connected as a differential pair and having respective first and second load resistors, a first current source FET connected in parallel with said first load resistor and a second current source FET connected in parallel with said second load resistor, with respective gate electrodes of said first and second current source FETs coupled to receive said first and second amplitude control signals respectively, a third current source FET and a first voltage control resistor which are connected in parallel between a fixed power supply voltage and a common connection of said first amplifier FET and first load resistor, and a fourth current source FET and a second voltage control resistor which are connected in parallel between said fixed power supply voltage and a common connection of said second amplifier FET and second load resistor, wherein said first and second DC component control voltages constitutes respective control signals which are applied to respective gate electrodes of said third and fourth current source FETs.

23. An AGC circuit as claimed in claim 20, wherein said differential amplification adjustment circuit section comprises first and second source follower circuits for outputting respective ones of complementary first and second output signals, and wherein each of said source follower circuits comprises a source follower FET having a drain electrode connected to a first fixed power supply voltage, and a first current source FET having a source electrode connected to a second fixed power supply voltage, and a parallel combination of a second current source FET and a voltage control resistor, connected between a source electrode of said source follower FET and a drain electrode of said first current source FET;

wherein said first and second DC component control voltages constitute respective control signals, said first DC component control voltage being supplied to a gate electrode of said second current source FET of said first source follower circuit and said second DC component control voltage being supplied to a gate electrode of said second current source FET of said second source follower circuit.

24. An AGC circuit as claimed in claim 20, wherein said gain-controlled amplifier means comprises a plurality of differential amplification adjustment circuit sections connected in cascade, for amplifying said first and second input signals to produce said complementary first and second controlled output signals from a final stage thereof, each of said differential amplification adjustment circuit sections controlled by said first and second amplitude control signals, a plurality of said DC component monitoring circuits, respectively corresponding to said differential amplification adjustment circuit sections, each said DC component monitoring circuit coupled to detect a DC component of a first one of a complementary pair of first and second output signals produced from the corresponding one of said differential amplification adjustment circuit sections, for producing a monitor voltage indicative of a DC component value of said output signal, and a plurality of voltage control circuit sections respectively corresponding to said differential amplification adjustment circuit sections and each coupled to receive one of a plurality of respectively separately determined DC component reference voltages, for comparing the monitor voltage produced from the corresponding one of the DC component monitoring circuits with the corresponding one of said DC component reference voltages to thereby derive a corresponding DC component control voltage, and supplying said corresponding DC component control voltage to the corresponding one of said differential amplification adjustment circuit sections.

25. An optical receiving apparatus comprising an opto-electric transducer for converting a received optical signal to an electrical signal, an AGC circuit as claimed in claim 1, coupled to receive said electrical signal, a clock signal generating section for generating a clock signal based on an electrical signal produced from said AGC circuit, a timing extraction circuit for adjusting the phase of said clock signal generated from said clock signal generating section, and a discrimination and regeneration section for performing discrimination of an electrical signal produced from said AGC circuit, based on said clock signal for which the phase has been adjusted by said timing extraction circuit.

26. An optical transmission system comprising an optical transmitting apparatus, an optical amplifier apparatus for amplifying an optical signal produced from said optical transmitting apparatus, an optical transmission path for conveying an optical signal which has been amplified by said optical transmitting apparatus, and an optical receiving apparatus as claimed in claim 25, for amplifying an optical signal which has been transmitted via said optical transmission path.

* * * * *